(12) United States Patent
Zhang et al.

(10) Patent No.: US 11,088,235 B2
(45) Date of Patent: Aug. 10, 2021

(54) DISPLAY PANEL AND DISPLAY DEVICE FOR IMPROVING DISPLAY EFFECT

(71) Applicant: Shanghai Tianma AM-OLED Co., Ltd., Shanghai (CN)

(72) Inventors: Mengmeng Zhang, Shanghai (CN); Xingyao Zhou, Shanghai (CN); Yue Li, Shanghai (CN); Shuai Yang, Shanghai (CN)

(73) Assignee: SHANGHAI TIANMA AM-OLED CO., LTD., Shanghai (CN)

( * ) Notice: Subject to any disclaimer, the term of this patent is extended or adjusted under 35 U.S.C. 154(b) by 90 days.

(21) Appl. No.: 16/675,240

(22) Filed: Nov. 6, 2019

(65) Prior Publication Data

US 2020/0075702 A1 Mar. 5, 2020

(30) Foreign Application Priority Data

Jun. 28, 2019 (CN) .......................... 201910580634.1

(51) Int. Cl.
*H01L 27/32* (2006.01)
*G09G 3/32* (2016.01)
*G09G 3/3258* (2016.01)

(52) U.S. Cl.
CPC ....... *H01L 27/3262* (2013.01); *G09G 3/3258* (2013.01); *H01L 27/3211* (2013.01); *H01L 27/3276* (2013.01); *G09G 2300/0452* (2013.01); *G09G 2310/08* (2013.01); *G09G 2320/0233* (2013.01)

(58) Field of Classification Search
CPC ............. H01L 27/3211; H01L 27/3262; H01L 27/3276; H01L 51/5004; H01L 27/3244; H01L 51/5056; H01L 51/5206; H01L 51/5265; H01L 51/5064; H01L 51/5221; H01L 25/0753; H01L 33/50; G09G 2300/0452; G09G 3/2074; G09G 3/3266; G09G 3/3258; H05B 45/46; H05B 45/00; H05B 45/20; H05B 47/10
USPC ..... 257/72; 438/48, 128, 149, 151, 157, 283
See application file for complete search history.

(56) References Cited

U.S. PATENT DOCUMENTS

| | | | |
|---|---|---|---|
| 2012/0217517 A1 | 8/2012 | Choi et al. | |
| 2016/0210896 A1 | 7/2016 | Gil | |
| 2017/0047550 A1* | 2/2017 | Lee | ..................... H01L 51/5056 |

(Continued)

FOREIGN PATENT DOCUMENTS

| | | |
|---|---|---|
| CN | 103943649 A | 7/2014 |
| CN | 104156526 A | 11/2014 |

(Continued)

*Primary Examiner* — Didarul A Mazumder
(74) *Attorney, Agent, or Firm* — Kilpatrick Townsend & Stockton, LLP

(57) ABSTRACT

A display panel and a display device are provided. The resistance of a first equivalent resistor is set to be larger than the resistance of a second equivalent resistor so that voltage across the first equivalent resistor can be higher. In this way, when a second type of sub-pixel is driven to be lightened, and a first type of sub-pixel is driven not to be lightened, the first type of sub-pixel can be avoided from being lightened, due to the higher voltage across the first equivalent resistor despite leakages current, thus alleviating a display abnormality, and improving a display effect.

16 Claims, 13 Drawing Sheets

(56) References Cited

U.S. PATENT DOCUMENTS

| | | | |
|---|---|---|---|
| 2018/0026219 A1* | 1/2018 | Li | H01L 51/5004 |
| | | | 257/40 |
| 2018/0042081 A1* | 2/2018 | Kaneko | H05B 45/46 |
| 2018/0294428 A1* | 10/2018 | Nishimura | H01L 51/5072 |
| 2019/0035861 A1* | 1/2019 | Wang | H01L 27/32 |
| 2019/0172895 A1* | 6/2019 | Liu | H01L 27/3211 |

FOREIGN PATENT DOCUMENTS

| | | |
|---|---|---|
| CN | 105428391 A | 3/2016 |
| CN | 106356378 A | 1/2017 |
| CN | 107749274 A | 3/2018 |
| CN | 107819022 A | 3/2018 |
| CN | 107871772 A | 4/2018 |
| CN | 108648690 A | 10/2018 |
| CN | 109599413 A | 4/2019 |
| CN | 109728068 A | 5/2019 |

* cited by examiner

DISPLAY PANEL AND DISPLAY DEVICE FOR IMPROVING DISPLAY EFFECT

CROSS-REFERENCES TO RELATED APPLICATIONS

This application claims priority to Chinese patent application No. 201910580634.1 filed on Jun. 28, 2019, which is incorporated herein by reference in its entirety.

FIELD

The present disclosure relates to the field of display technologies, and particularly to a display panel and a display device.

BACKGROUND

An Organic Light-Emitting Diode (OLED), a Quantum dot Light-Emitting Diode (QLED), and other light-emitting diodes are widely applied in the field of display technologies due to their advantages of self-emission, low power consumption, etc. A light-emitting diode generally emits light when voltage across the light-emitting diode is higher than its turn-on voltage. However there are different turn-on voltages for different light-emitting diodes so that when only a light-emitting diode with higher turn-on voltage is turned-on and lightened, a light-emitting diode with lower turn-on voltage may also be lightened, thus resulting in a display abnormality.

SUMMARY

Embodiments of the disclosure provide a display panel and a display device so as to improve a display effect.

An embodiment of the disclosure provides a display panel. The display panel includes a plurality of pixel elements and a first power supply line, and each pixel element includes a plurality of sub-pixels, each sub-pixel includes a light-emitting element and a pixel circuit, and an anode of the light-emitting element is electrically connected with the first power supply line through the pixel circuit;

the plurality of sub-pixels include a first type of sub-pixels and a second type of sub-pixels, and a turn-on voltage of the light-emitting element in each of the first type of sub-pixels is lower than a turn-on voltage of the light-emitting element in each of the second type of sub-pixels; and there are a first equivalent resistor between the anode of the light-emitting element in each of the first type of sub-pixels and the first power supply line, and a second equivalent resistor between the anode of the light-emitting element in each of the second type of sub-pixels and the first power supply line, and resistance of the first equivalent resistor is larger than resistance of the second equivalent resistor.

In one embodiment of the disclosure, the pixel circuit includes a plurality of thin film transistors electrically connected between the first power supply line and the anode of the light-emitting element;

the resistance of the first equivalent resistor is a sum of resistances of active layers of all the thin film transistors electrically connected between the first power supply line and the anode of the light-emitting element in one of the first type of sub-pixels; and the resistance of the second equivalent resistor is a sum of resistances of active layers of all the thin film transistors electrically connected between the first power supply line, and the anode of the light-emitting element in one of the second type of sub-pixels.

In one embodiment of the disclosure, the active layer of each of the thin film transistors includes a channel area, and a source electrode area, and a drain electrode area located respectively on two sides of the channel area;

the resistance of the first equivalent resistor is a sum of resistances of the source electrode areas and resistances of the drain electrode areas of all the thin film transistors electrically connected between the first power supply line and the anode of the light-emitting element in one of the first type of sub-pixels; and the resistance of the second equivalent resistor is a sum of resistances of the source electrode areas and resistances of the drain electrode areas of all the thin film transistors electrically connected between the first power supply line and the anode of the light-emitting element in one of the second type of sub-pixels.

In one embodiment of the disclosure, the first type of sub-pixels include sub-pixels in a first color, and the second type of sub-pixels include sub-pixels in a third color; and for at least one electrode area of the source electrode area and the drain electrode area of transistor in the same position in different sub-pixels, resistance of the electrode area of the transistor in the same position in each sub-pixel in the first color is larger than resistance of the electrode area of the transistor in the same position in each sub-pixel in the third color, and resistance of the other electrode area of each other transistor in each sub-pixel in the first color is same as resistance of the other electrode area of each other transistor in each sub-pixel in the third color.

In one embodiment of the disclosure, the first type of sub-pixels include sub-pixels in a second color, and the second type of sub-pixels include sub-pixels in a third color; and for at least one electrode area of the source electrode area and the drain electrode area of transistor in the position in different sub-pixels, resistance of the electrode area of the transistor in the same position in each sub-pixel in the second color is larger than resistance of the electrode area of the transistor in the same position in each sub-pixel in the third color, and resistance of the other electrode area of each other transistor in each sub-pixel in the second color is same as resistance of the other electrode area of each other transistor in each sub-pixel in the third color.

In one embodiment of the disclosure, the first type of sub-pixels further include sub-pixels in a second color; and resistance of the electrode area of the transistor in the same position in each sub-pixel in the second color is larger than resistance of the electrode area of the transistor in the same position in each sub-pixel in the third color, and resistance of the other electrode area of each other transistor in each sub-pixel in the second color is same as resistance of the other electrode area of each other transistor in each sub-pixel in the third color.

In one embodiment of the disclosure, the plurality of thin film transistors include a driver transistor, a first light-emitting control transistor, and a second light-emitting control transistor;

the first light-emitting control transistor has a source electrode area electrically connected with the first power supply line, and a drain electrode area electrically connected with a source electrode area of the driver transistor; and the driver transistor has a drain electrode area electrically connected with a source electrode area of the second light-emitting control transistor, and the second light-emitting control transistor has a drain electrode area electrically connected with the anode of the light-emitting element.

In one embodiment of the disclosure, a cross-sectional area of the electrode area with a larger resistance is smaller than a cross-sectional area of the electrode area with a smaller resistance;

a resistivity of the electrode area with the larger resistance is larger than or equal to a resistivity of the electrode area with the smaller resistance; and a length of the electrode area with the larger resistance is larger than or equal to a length of the electrode area with the smaller resistance.

In one embodiment of the disclosure, a resistivity of the electrode area with a larger resistance is larger than a resistivity of an electrode area with a smaller resistance;

a length of the electrode area with the larger resistance is the same as a length of the electrode area with the smaller resistance; and a cross-sectional area of the electrode area with the larger resistance is the same as a cross-sectional area of the electrode area with the smaller resistance.

In one embodiment of the disclosure, a length of the electrode area with a larger resistance is larger than a length of the electrode area with a smaller resistance;

a cross-sectional area of the electrode area with the larger resistance is the same as a cross-sectional area of the electrode area with the smaller resistance; and a resistivity of the electrode area with the larger resistance is the same as a resistivity of the electrode area with the smaller resistance.

In one embodiment of the disclosure, the sub-pixels in the first color are red sub-pixels, the sub-pixels in the second color are green sub-pixels, and the sub-pixels in the third color are blue sub-pixels.

Correspondingly an embodiment of the disclosure further provides a display device including the display panel above.

In the display panel and the display device according to the embodiments of the disclosure, the voltage difference U0 between the first power supply line PVDD and the second power supply line PVEE in each of the first type of sub-pixels is the sum of the voltage difference U11 between the anode of the light-emitting element L-1 and the first power supply line PVDD, and the voltage difference U12 between the anode and the cathode of the light-emitting element L-1, that is, U0=U11+U12; and the voltage difference U0 between the first power supply line PVDD and the second power supply line PVEE in each of the second type of sub-pixels is the sum of the voltage difference U21 between the anode of the light-emitting element L-2 and the first power supply line PVDD, and the voltage difference U22 between the anode and a cathode of the light-emitting element L-2, that is, U0=U21+U22. The resistance of the first equivalent resistor RE1 is larger than the resistance of the second equivalent resistor RE2 so that voltage across the first equivalent resistor RE1 is higher, so U11 is higher, and thus U12 is lower. In this way, when the second type of sub-pixel Subpx-2 is driven to be lightened, and the first type of sub-pixel Subpx-1 is driven not to be lightened, U12 can be lower than the turn-on voltage of the light-emitting element L-1 due to the higher voltage across the first equivalent resistor RE1 despite leakages current, so that the first type of sub-pixel can be avoided from being lightened, to thereby alleviate a display abnormality, and improve a display effect.

DETAILED DESCRIPTION

Figure 1:
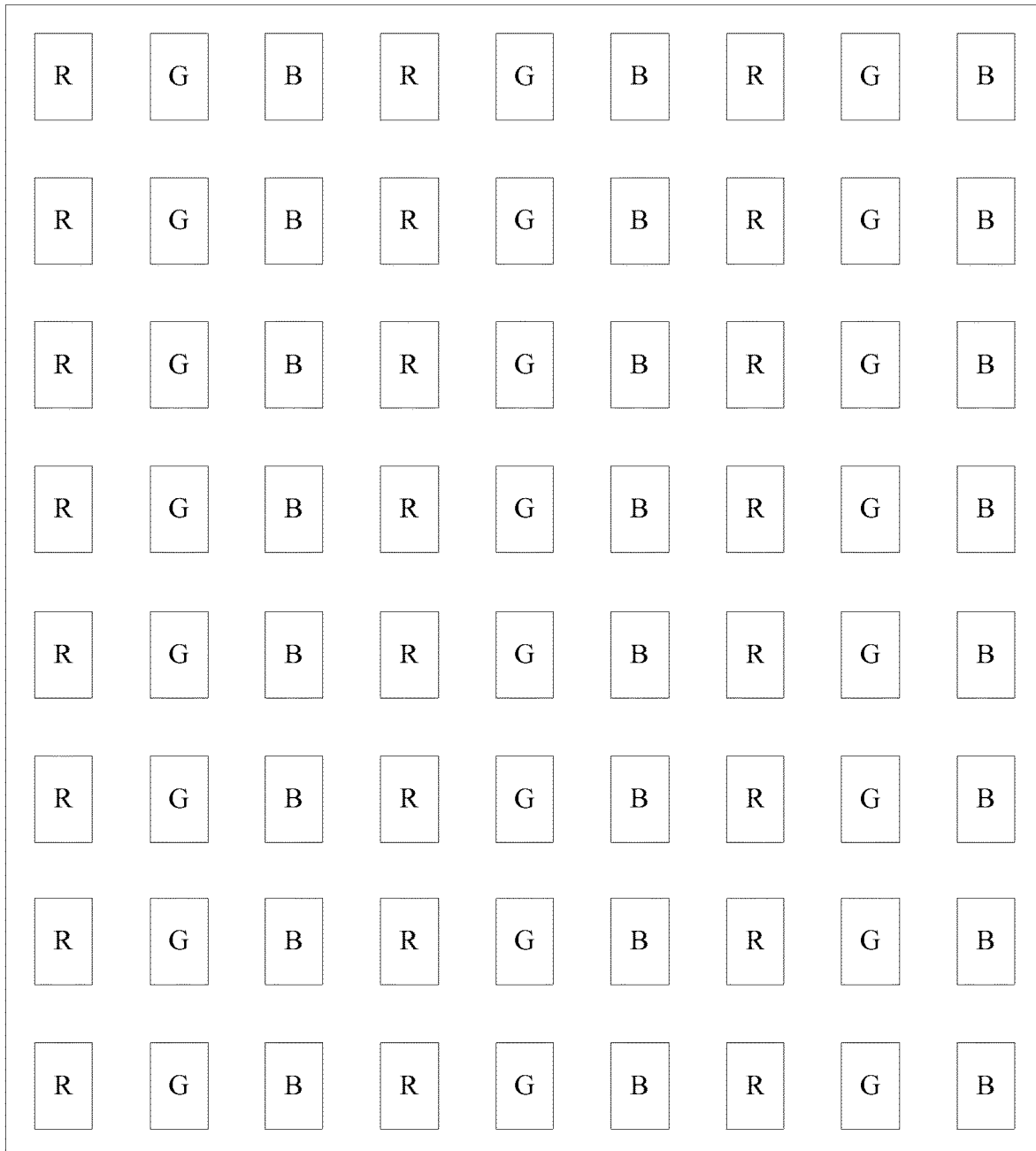
FIG. 1 is a schematic structural diagram of a display panel in the related art.

The terms "first", "second", or the like throughout the disclosure do not suggest any order, number or significance, but is only intended to distinguish different components from each other. Alike the terms "include", "comprise", or the like refer to that an element or an item preceding to the term encompasses an element(s) or an item(s) succeeding to the term, and its (or their) equivalence(s), but shall not preclude another element(s) or item(s). The term "connect", "connected", or the like does not suggest physical or mechanical connection, but may include electrical connection no matter whether it is direct or indirect.

It shall be noted that the sizes and the shapes of respective components in the drawings are not intended to reflect any real proportion, but only intended to illustrate the disclosure of the disclosure. Like or similar reference numerals will refer to like or similar elements, or elements with like or similar functions throughout the drawings.

Figure 2:
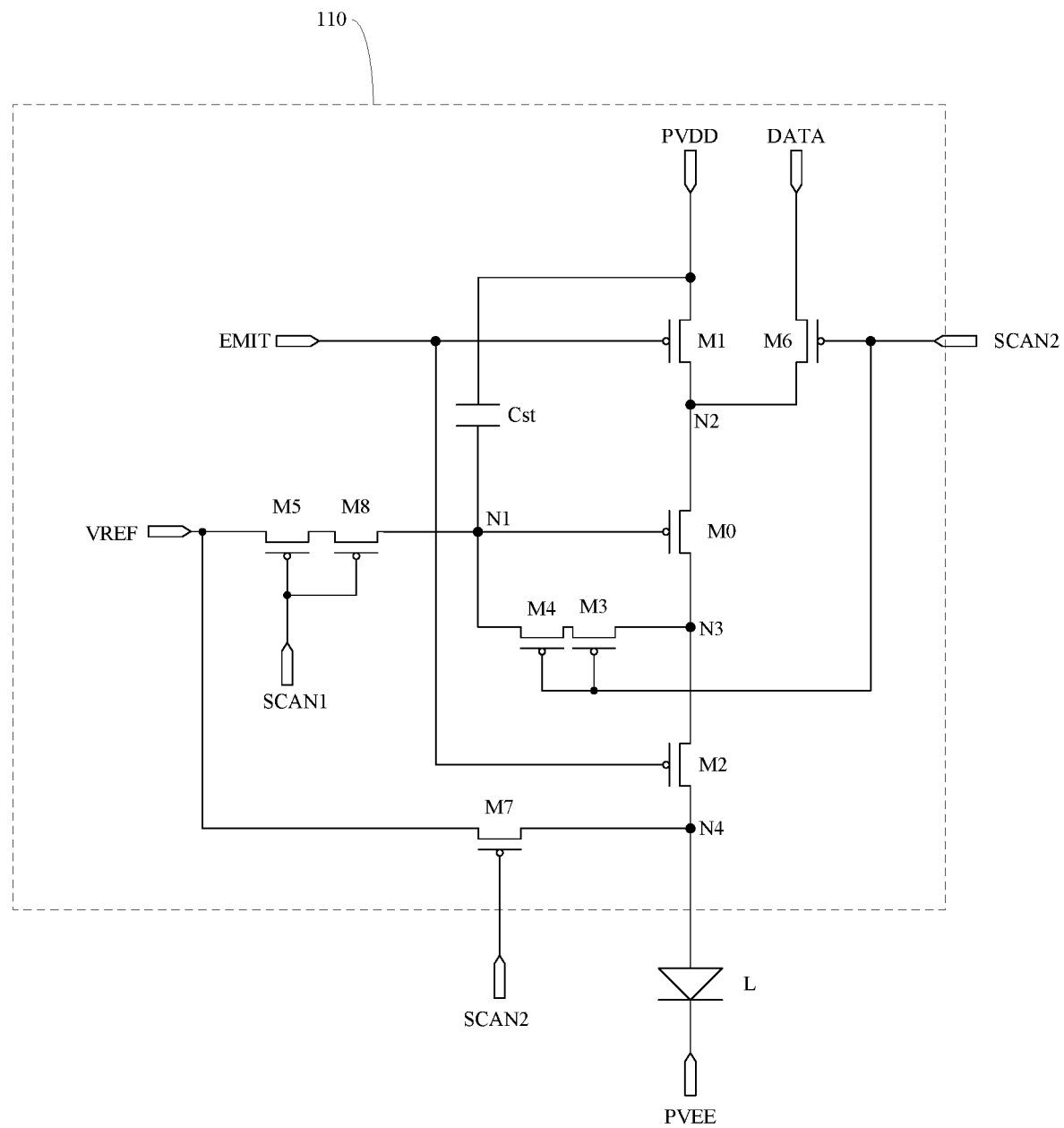
FIG. 2 is a schematic structural diagram of a pixel circuit in accordance with an embodiment of the disclosure.
Figure 3:
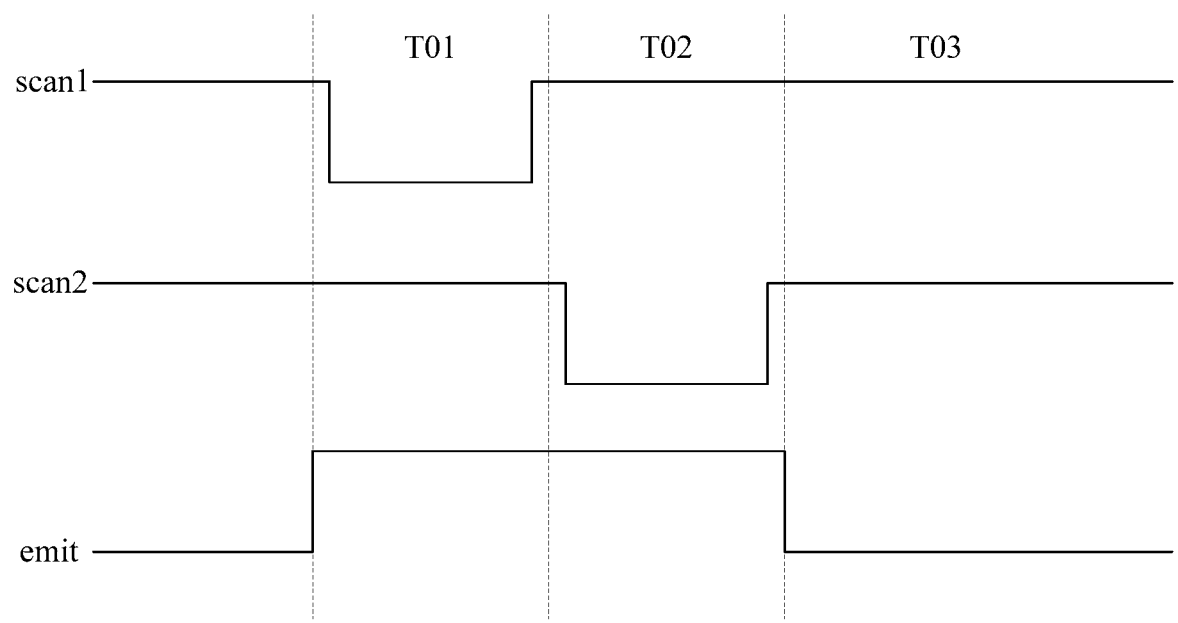
FIG. 3 is a circuit timing diagram of the pixel circuit in accordance with the embodiment of the disclosure.

As illustrated in FIG. 1 and FIG. 2, a display panel can include a plurality of pixel elements, each of which includes a plurality of sub-pixels, and each sub-pixel includes a light-emitting element L and a pixel circuit 110. The pixel circuit 110 can include a driver transistor M0, a first light-emitting control transistor M1, a second light-emitting control transistor M2, third to eighth switch transistors M3 to M8, and a storage capacitor Cst. FIG. 3 illustrates a circuit timing diagram corresponding to the pixel circuit as illustrated in FIG. 2, where scan1 represents a signal transmitted on a first scan line SCAN1, scan2 represents a signal transmitted on a second scan line SCAN2, and emit represents a signal transmitted on a light-emitting control line EMIT.

Furthermore the pixel circuit as illustrated in FIG. 2 can address, through internal compensation under the control of the circuit timing diagram as illustrated in FIG. 3, such a problem that display non-uniformity may occur because threshold voltage Vth of the driver transistor M0 drifts due to a process factor, and aging of the transistor.

Figure 4:
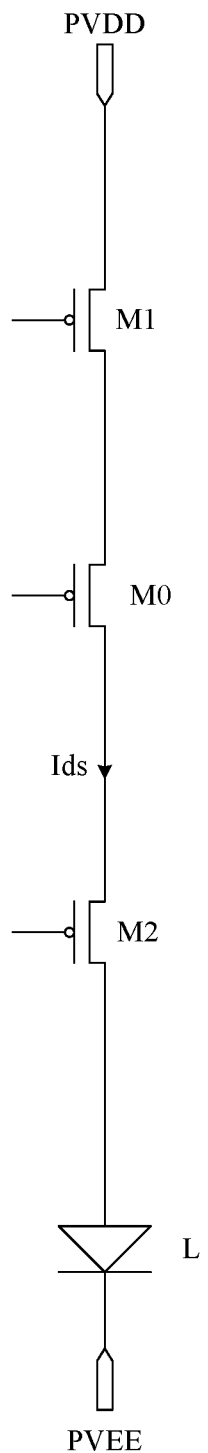
FIG. 4 is an equivalent circuit diagram of a flowing path of the driving current Ids when a driver transistor drives a light-emitting element to emit light in accordance with an embodiment of the disclosure.

In one embodiment, FIG. 4 is an equivalent circuit diagram of a flow path of driving current Ids when the driver transistor M0 drives the light-emitting element L to emit light. In one embodiment, as illustrated in FIG. 2 to FIG. 4, a high-voltage signal is transmitted on a first power line PVDD, a low-voltage signal is transmitted on a second power line PVEE, and the driving current Ids flows through the first light-emitting control transistor M1, the driver transistor M0, and the second light-emitting control transistor M2 respectively from the first power line PVDD to thereby flow into an anode of the light-emitting element L, so as to drive the light-emitting element L to emit light. It shall be noted that an operating process of the pixel circuit as illustrated in FIG. 2 in combination with the circuit timing diagram as illustrated in FIG. 3 can be substantially the same as in the related art, so a repeated description thereof will be omitted here.

Since the anodes of the light-emitting elements L in adjacent sub-pixels generally may not be completely insulated from each other, there may be leakage current between the adjacent sub-pixels. As illustrated in FIG. 1 and FIG. 4, the pixel element can include a red sub-pixel R, a green sub-pixel G, and a blue sub-pixel B. Generally the turn-on voltage of the light-emitting element L in the blue sub-pixel B is higher than the turn-on voltage of the light-emitting element L in the red sub-pixel B and the green sub-pixel G, and when the blue sub-pixel B in the display panel is driven to be lightened, and the red sub-pixel R and the green sub-pixel G are driven not to be lightened, the driving current Ids in the blue sub-pixel B may charge the anodes of the light-emitting elements L in the red sub-pixel R and the green sub-pixel G due to the leakage current, so that the red sub-pixel R and the green sub-pixel G may also be lightened, thus resulting in a display abnormality, and degrading a display effect.

In view of this, an embodiment of the disclosure provides a display panel so as to alleviate the display abnormality, and to improve the display effect.

Figure 5:
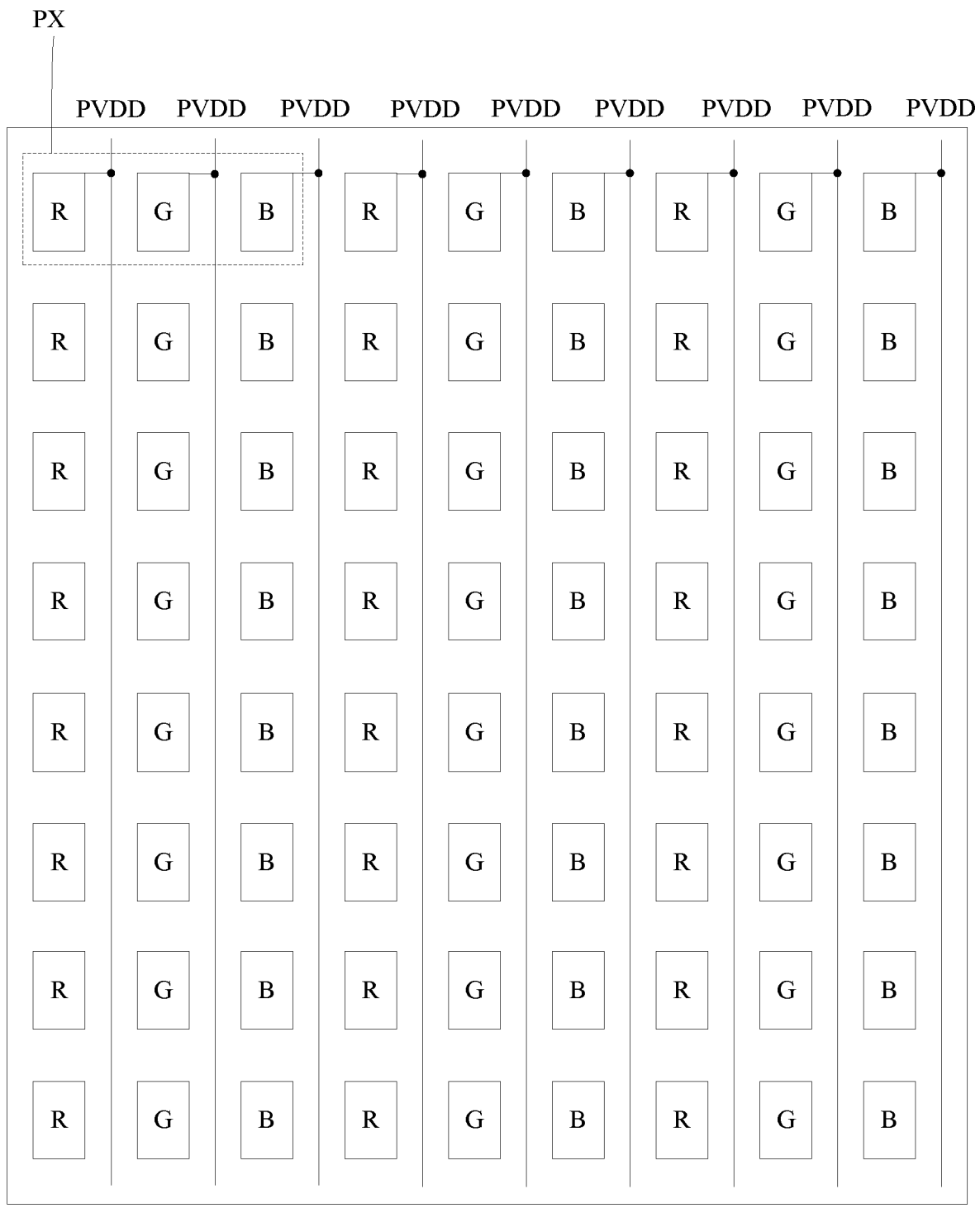
FIG. 5 is a schematic structural diagram of a display panel in accordance with an embodiment of the disclosure.
Figure 7:
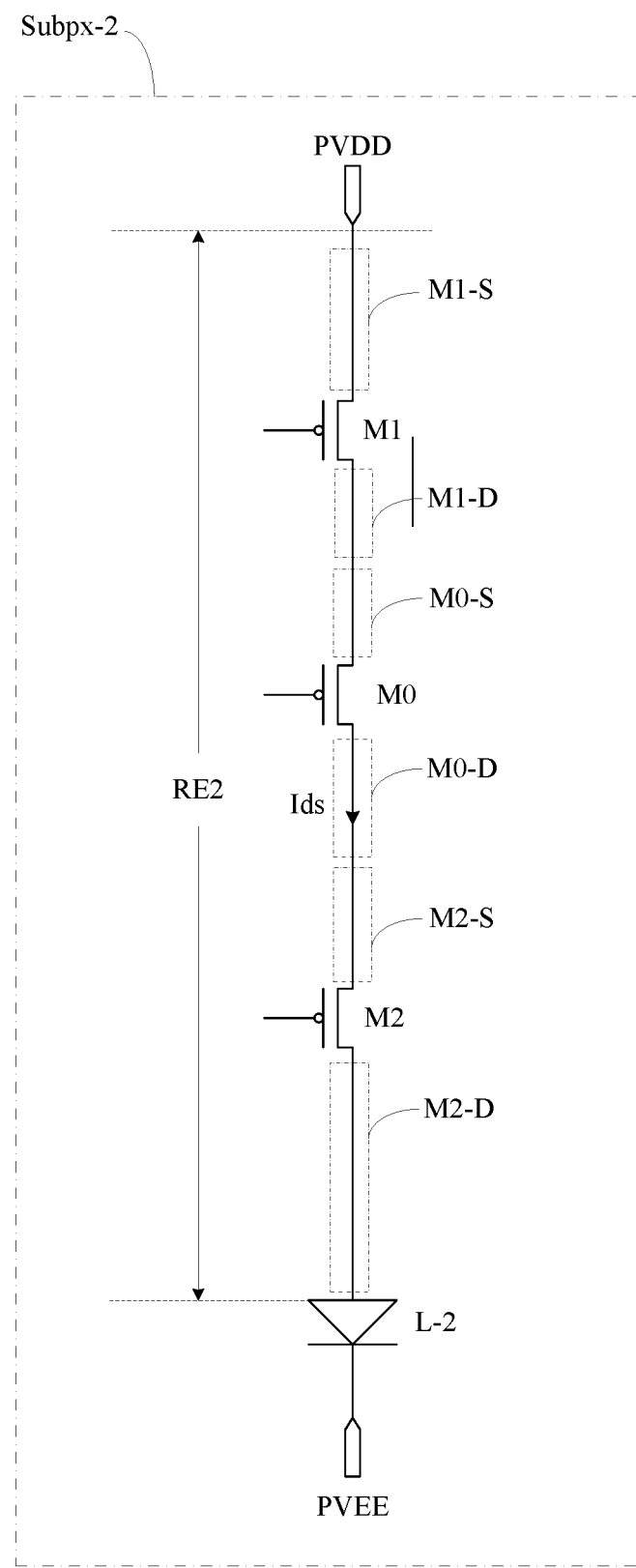
FIG. 7 is an equivalent circuit diagram of a flowing path of the driving current Ids in a second type of sub-pixel in accordance with an embodiment of the disclosure.

As illustrated in FIG. 2, FIG. 5, and FIG. 7, a display panel according to an embodiment of the disclosure includes a plurality of pixel elements PX and a first power supply line PVDD, where each pixel element PX can include a plurality of sub-pixels, each sub-pixel can include a light-emitting element L and a pixel circuit 110, and an anode of the light-emitting element L is electrically connected with the first power supply line PVDD through the pixel circuit 110. The plurality of sub-pixels can include a first type of sub-pixels Subpx-1 and a second type of sub-pixels Subpx-2, where turn-on voltage of the light-emitting element L-1 in the first type of sub-pixel Subpx-1 is lower than turn-on voltage of the light-emitting element L-2 in the second type of sub-pixel Subpx-2. There are a first equivalent resistor RE1 between the anode of the light-emitting element L-1 in each sub-pixel among the first type of sub-pixels Subpx-1, and the first power supply line PVDD, and a second equivalent resistor RE2 between the anode of the light-emitting element L-2 in each sub-pixel among the second type of sub-pixels Subpx-2, and the first power supply line PVDD, where the resistance of the first equivalent resistor RE1 is larger than the resistance of the second equivalent resistor RE2.

In the display panel according to the embodiment of the disclosure, the voltage difference U0 between the first power supply line PVDD and a second power supply line PVEE in each sub-pixel among the first type of sub-pixels is the sum of the voltage difference U11 between the anode of the light-emitting element L-1 and the first power supply line PVDD, and the voltage difference U12 between the anode and a cathode of the light-emitting element L-1, that is, U0=U11+U12; and the voltage difference U0 between the first power supply line PVDD and the second power supply line PVEE in each sub-pixel among the second type of sub-pixels is the sum of the voltage difference U21 between the anode of the light-emitting element L-2 and the first power supply line PVDD, and the voltage difference U22 between the anode and a cathode of the light-emitting element L-2, that is, U0=U21+U22. The resistance of the first equivalent resistor RE1 can be made larger than the resistance of the second equivalent resistor RE2 so that voltage across the first equivalent resistor RE1 is higher, so U11 is higher, and thus U12 is lower. In this way, when the second type of sub-pixel Subpx-2 is driven to be lightened, and the first type of sub-pixel Subpx-1 is driven not to be lightened, U12 can be lower than the turn-on voltage of the light-emitting element L-1 due to the higher voltage across the first equivalent resistor RE1 despite leakages current, so that the first type of sub-pixel can be avoided from being lightened, to thereby alleviate a display abnormality, and improve a display effect.

As illustrated in FIG. 5, in a specific implementation, the display panel further includes a base substrate on which the pixel elements and other driving signal lines are formed, where the plurality of sub-pixels in each pixel element can include a red sub-pixel R, a green sub-pixel G, and a blue sub-pixel B, thus red, green, and blue light can be mixed to thereby display a chromatic image; or the plurality of sub-pixels in each pixel element can include a red sub-pixel, a green sub-pixel, a blue sub-pixel, and a white sub-pixel, thus red, green, blue, and white light can be mixed to thereby display a chromatic image. Of course, the colors of light emitted by the sub-pixels in the pixel element can be determined as needed in a real application environment, so the embodiment of the disclosure will not be limited thereto.

In one embodiment, each light-emitting element includes the anode, a light-emitting layer, and the cathode. The pixel circuit can be electrically connected with the anode of the light-emitting element so that an anode of the pixel circuit is the anode of the light-emitting element; and the cathode of the light-emitting element can be electrically connected with the second power supply line so that a cathode of the pixel circuit is the cathode of the light-emitting element. Furthermore the light-emitting element can include at least one of an OLED and a QLED.

Figure 6:
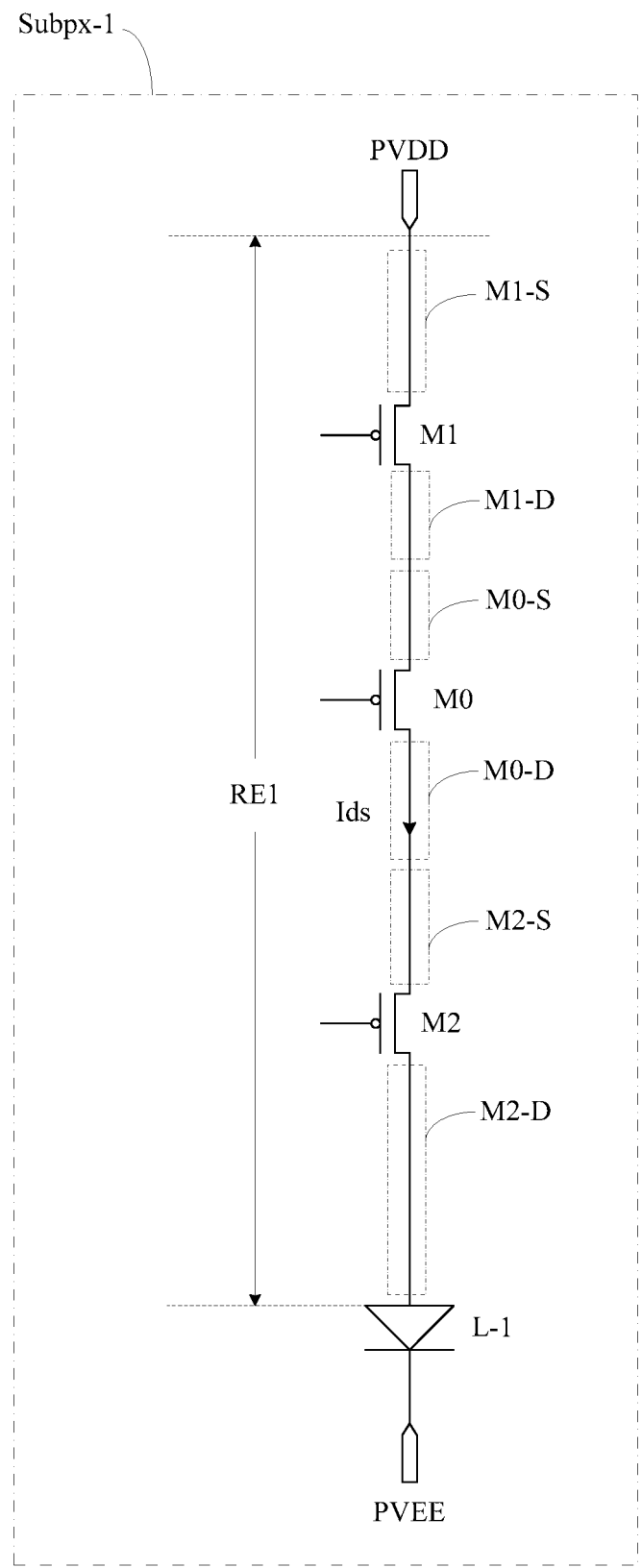
FIG. 6 is an equivalent circuit diagram of a flowing path of the driving current Ids in a first type of sub-pixel in accordance with an embodiment of the disclosure.
Figure 8:
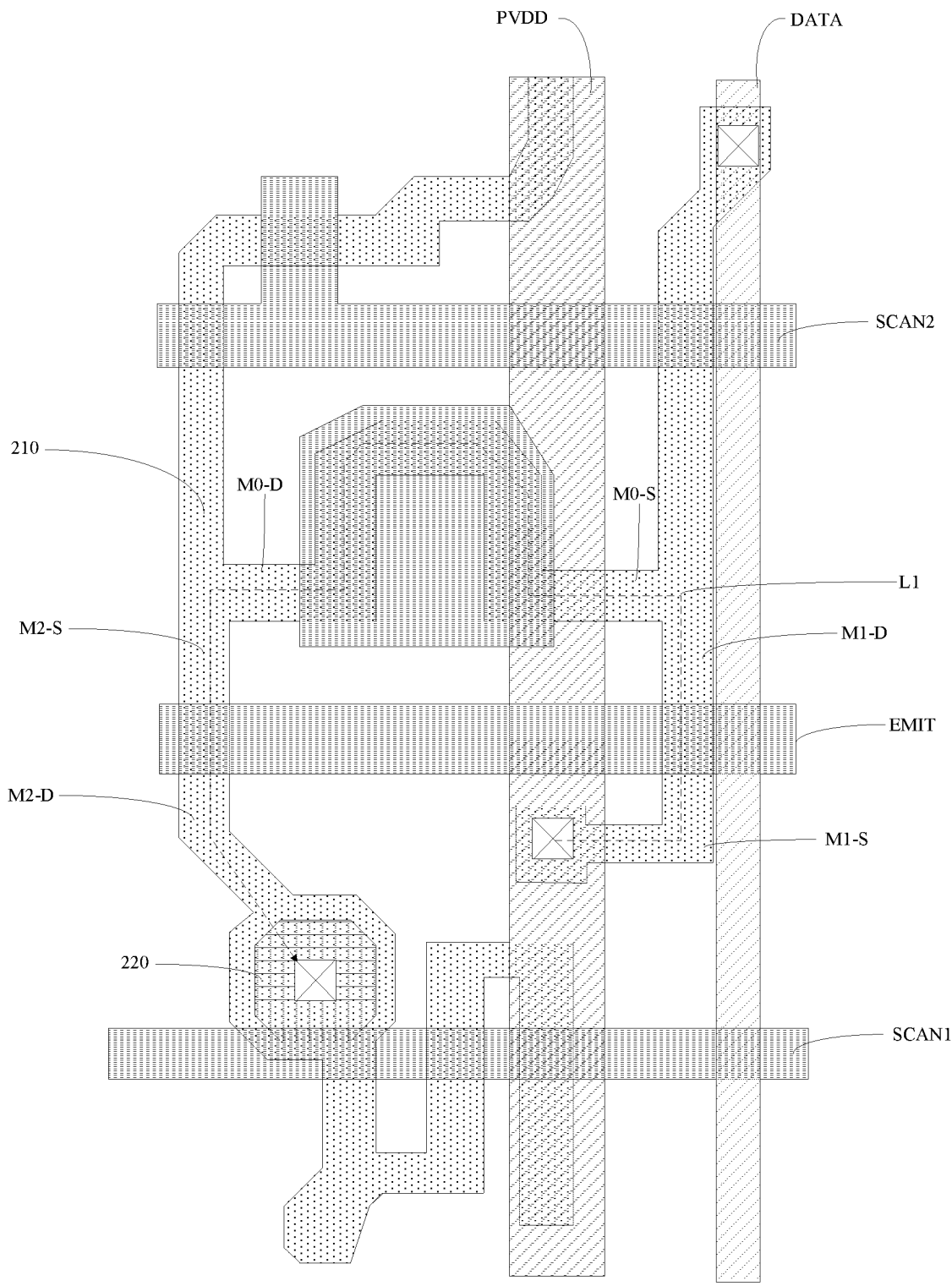
FIG. 8 is a schematic diagram of a part of a layout of a pixel circuit in accordance with an embodiment of the disclosure.
Figure 9:
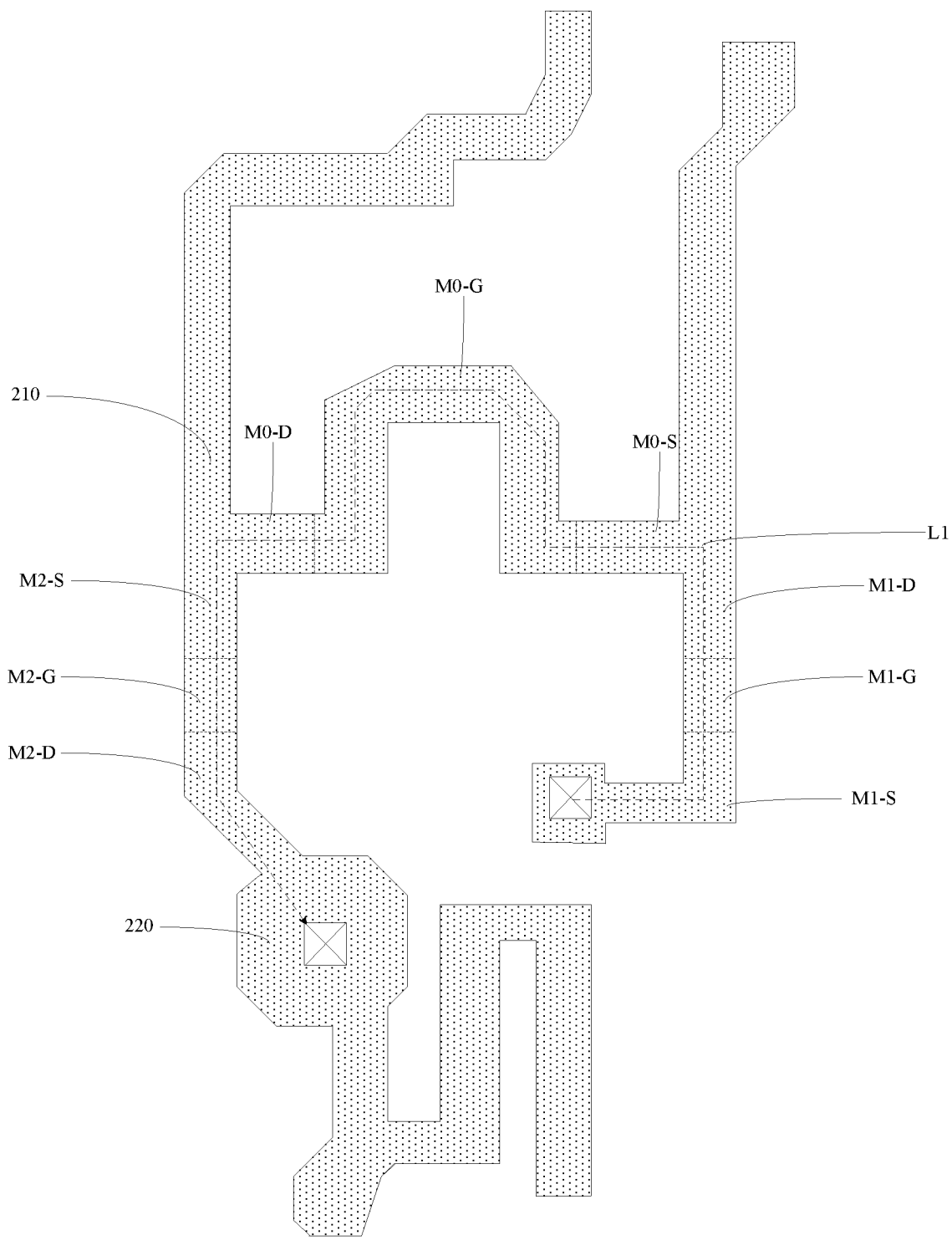
FIG. 9 is a schematic diagram of a layout of some semiconductor layer in accordance with an embodiment of the disclosure.
Figure 10:
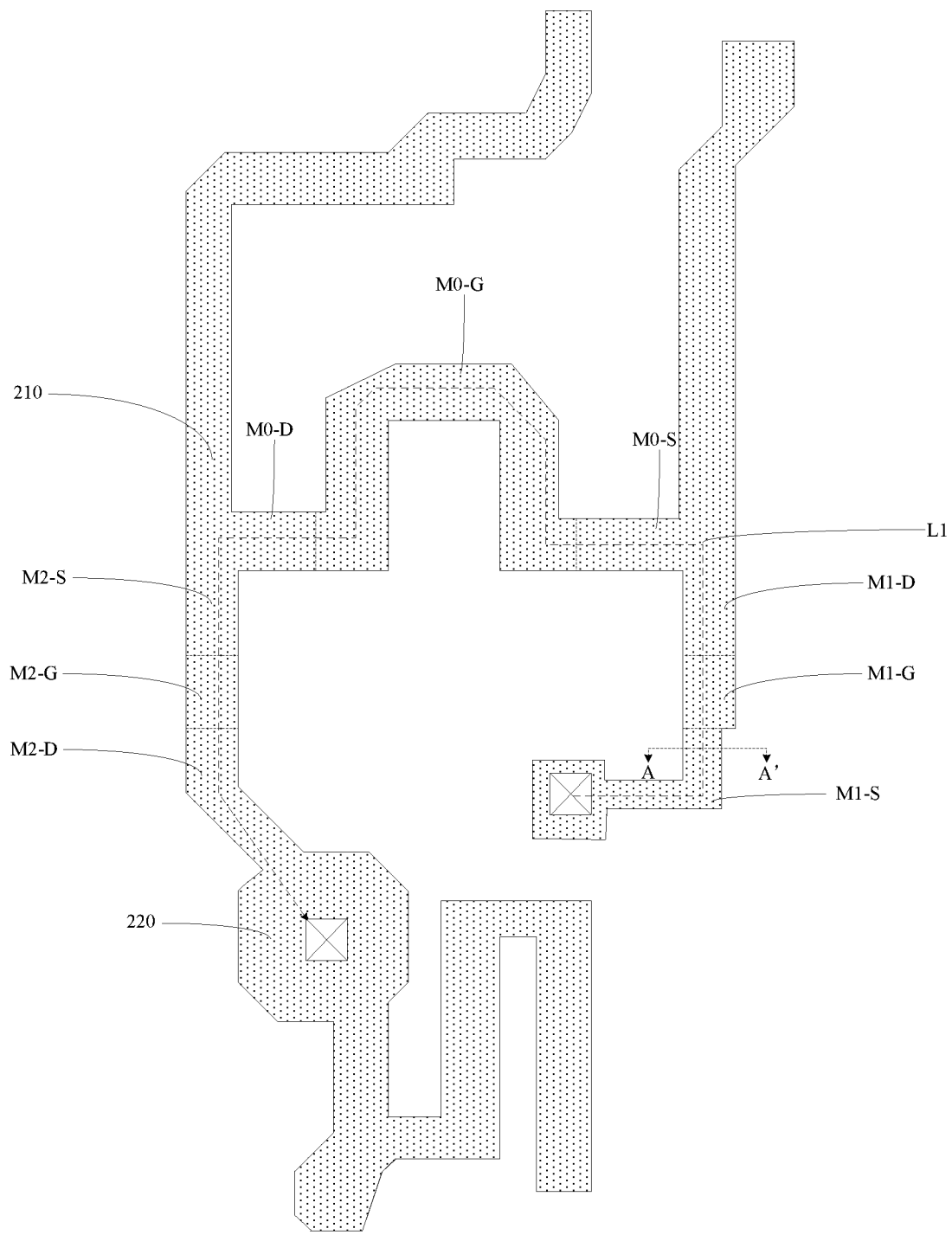
FIG. 10 is a schematic diagram of a layout of some other semiconductor layer in accordance with an embodiment of the disclosure.
Figure 11:
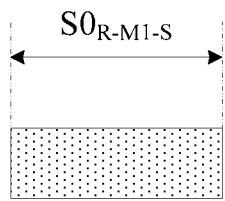
FIG. 11 is a schematic structural diagram of the semiconductor layer as illustrated in FIG. 10 in a sectional view along AA'.
Figure 12:
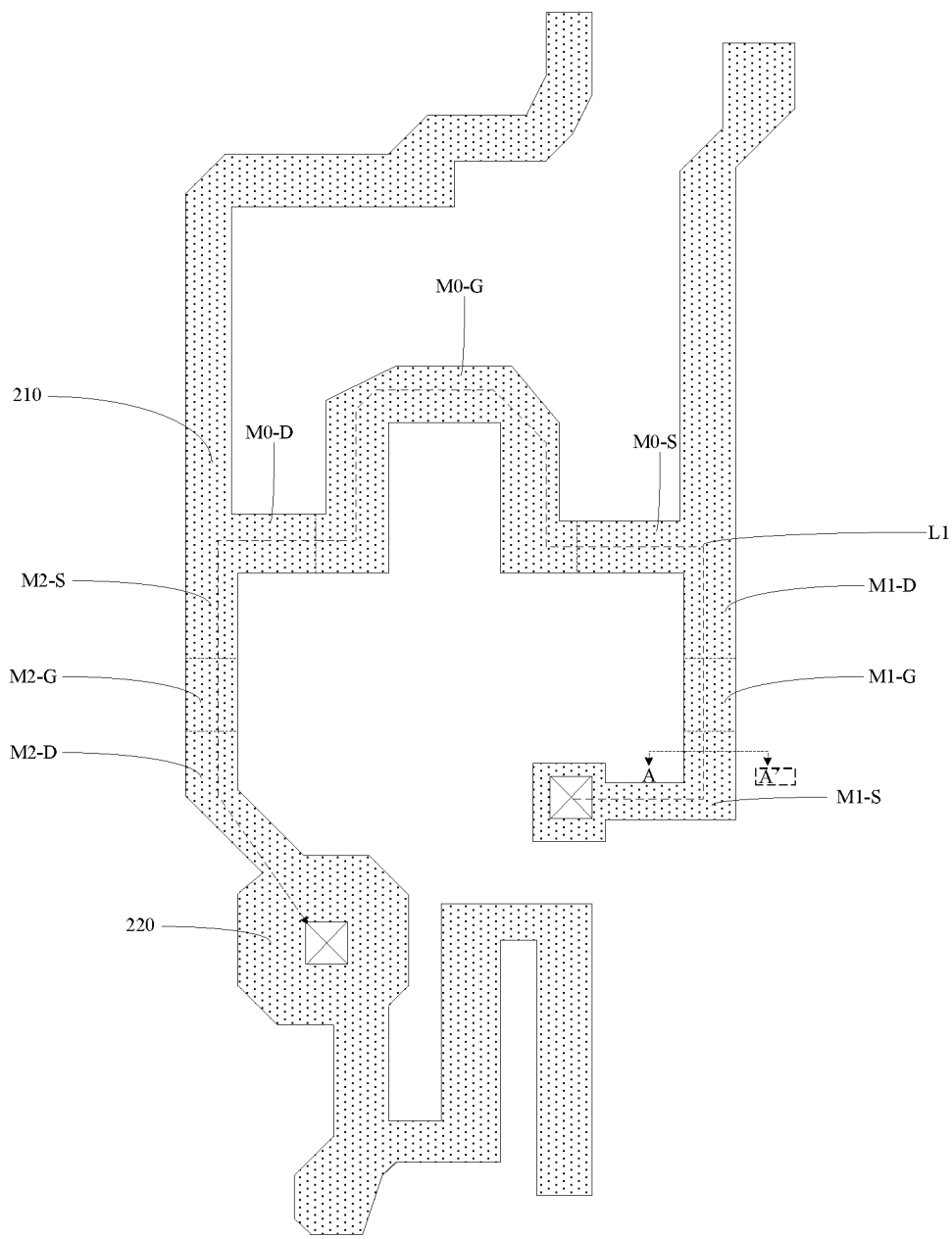
FIG. 12 is a schematic diagram of a layout of some other semiconductor layer in accordance with an embodiment of the disclosure.
Figure 13:
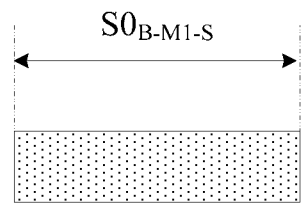
FIG. 13 is a schematic structural diagram of the semiconductor layer as illustrated in FIG. 12 in a sectional view along AA'.
Figure 14:
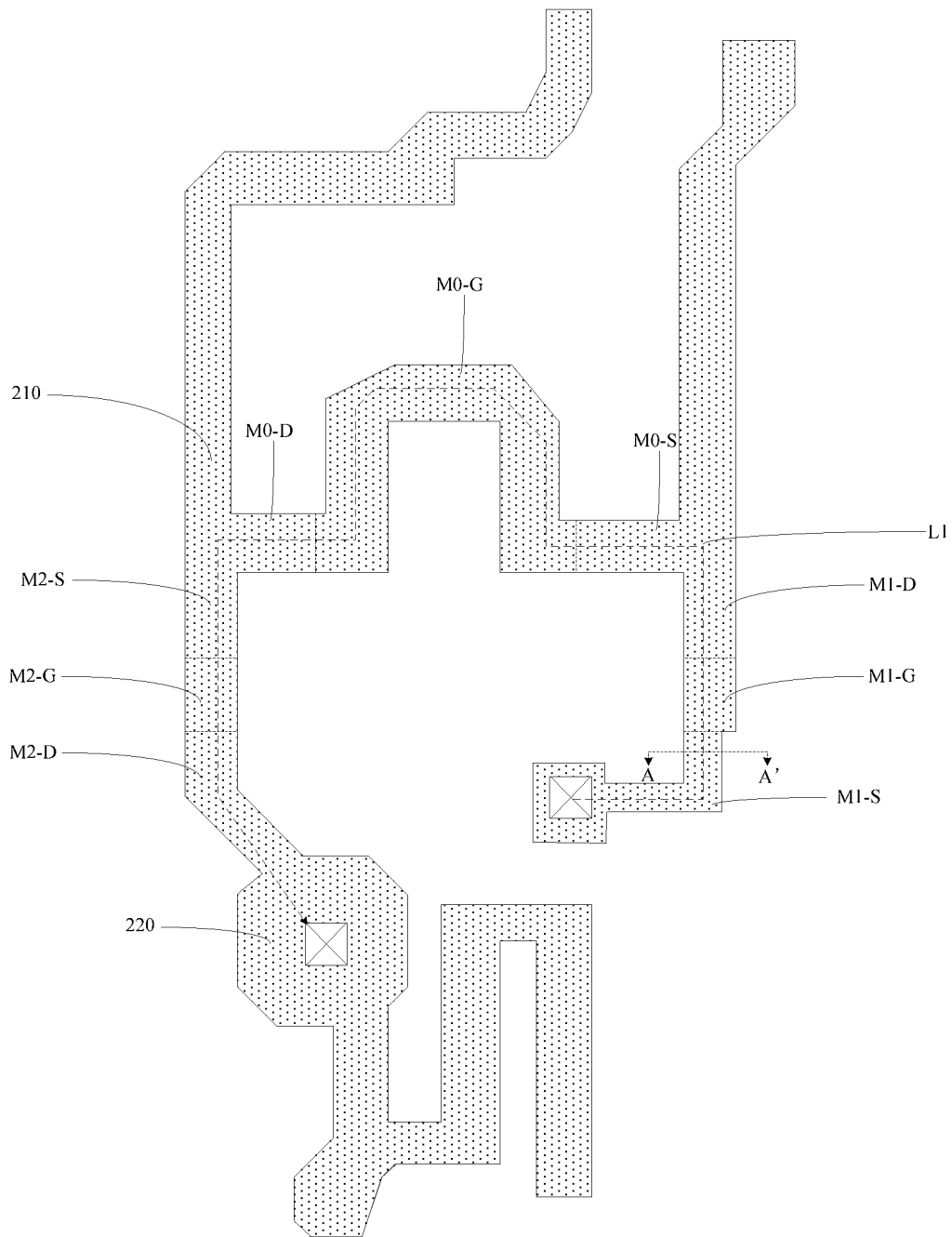
FIG. 14 is a schematic diagram of a layout of some other semiconductor layer in accordance with an embodiment of the disclosure.
Figure 15:
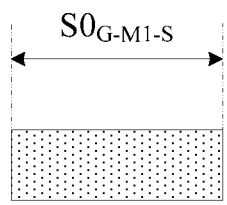
FIG. 15 is a schematic structural diagram of the semiconductor layer as illustrated in FIG. 14 in a sectional view along AA'.

In one embodiment, in a specific implementation, in the embodiment of the disclosure, as illustrated in FIG. 2, FIG. 6, and FIG. 7, the pixel circuit 110 can include a plurality of thin film transistors electrically connected between the first power supply line PVDD, and the anode of the light-emitting element L, so that the driving current Ids can flow through these thin film transistors and then input to the light-emitting element L. FIG. 8 illustrates a layout diagram of the pixel circuit according to the embodiment of the disclosure, where only a part of layers (the active layer, for example) of the transistors, a first scan line SCAN1, a second scan line SCAN2, and a light-emitting control line EMIT in the pixel circuit, and the anode of the light-emitting element are illustrated. A semiconductor layer 210 is electrically connected with the first power supply line PVDD through a first via-hole, and the semiconductor layer 210 is electrically connected with the anode 220 of the light-emitting element L through a second via-hole. The plurality of thin film transistors electrically connected between the first power supply PVDD, and the anode of the light-emitting element L can be formed at a semiconductor layer 210 in FIG. 8. The semiconductor layer 210 can have bent shape or folded shape. The semiconductor layer 210 can include an active layer corresponding to each thin film transistor so that the driving current Ids flows through a path L1 formed of the active layer of these thin film transistors and then input to the anode 220 of the light-emitting element L.

In one embodiment, in a specific implementation, in the embodiment of the disclosure, as illustrated in FIG. 6, the resistance of the first equivalent resistor RE1 can be the sum of the resistances of the active layers of all thin film transistors electrically connected between the first power supply line PVDD, and the anode of the light-emitting element L in a sub-pixel among the first type of sub-pixels Subpx-1.

In one embodiment, in a specific implementation, in the embodiment of the disclosure, as illustrated in FIG. 7, the resistance of the second equivalent resistor RE2 can be the sum of the resistances of the active layers of all thin film transistors electrically connected between the first power supply line PVDD, and the anode of the light-emitting element L in a sub-pixel among the second type of sub-pixels Subpx-2.

In one embodiment, the semiconductor layers have the same layer thickness, that is, the layer thicknesses of the respective active layers are same. Furthermore the material of the active layers can include poly-silicon. Of course, the material of the semiconductor layers can include another material in a real application, so the embodiment of the disclosure will not be limited thereto.

Generally each active layer can include a channel area, a source electrode area, and a drain electrode area. The channel area may not be doped with any impurity so that the channel area has semiconductor characteristic. The source electrode area and the drain electrode area are located respectively on two sides of the channel area, and the source electrode area and the drain electrode area are doped with impurities so that the source electrode area and the drain electrode area have conductivity. The type of the impurities can vary as the thin film transistor is a P-type or N-type transistor. In a specific implementation, the active layer of each thin film transistor can include a channel area, and a source electrode area and a drain electrode area located respectively on two sides of the channel area. Since the resistance of a channel area significantly varies with gate voltage, in order to guarantee the performance of the channel area, in the embodiment of the disclosure, the resistance of the first equivalent resistor can be the sum of the resistances of the source electrode areas and the resistances of the drain electrode areas of all thin film transistors electrically connected between the first power supply line, and the anode of the light-emitting element in a sub-pixel among the first type of sub-pixels, and the resistance of the second equivalent resistor can be the sum of the resistances of the source electrode areas and the resistances of the drain electrode areas of all thin film transistors electrically connected between the first power supply line, and the anode of the light-emitting element in a sub-pixel among the second type of sub-pixels.

In a specific implementation, in the embodiment of the disclosure, as illustrated in FIG. 2 and FIG. 6 to FIG. 9, the plurality of thin film transistors can include a driver transistor M0, a first light-emitting control transistor M1, and a second light-emitting control transistor M2, where the first light-emitting control transistor M1 has a source electrode area M1-S electrically connected with the first power supply line PVDD, and a drain electrode area M1-D electrically connected with a source electrode area M0-S of the driver transistor M0, the driver transistor M0 has a drain electrode area M0-D electrically connected with a source electrode area M2-S of the second light-emitting control transistor M2, and the second light-emitting control transistor M2 has a drain electrode area M2-D electrically connected with the anode of the light-emitting element L, where the source electrode area M1-S and the drain electrode area M1-D of the first light-emitting control transistor M1 are located respectively on two sides of a channel area M1-G thereof, the source electrode area M0-S and the drain electrode area M0-D of the driver transistor M0 are located respectively on two sides of a channel area M0-G thereof, and the source electrode area M2-S and the drain electrode M2-D of the second light-emitting control transistor M2 are located respectively on two sides of a channel area M2-G thereof, so that the first light-emitting control transistor M1, the driver transistor M2, and the second light-emitting control transistor M2 can form the path L1 through which the driving current Ids flows. Furthermore reference can be made to FIG. 2 for a specific structure of the pixel circuit according to the embodiment of the disclosure, so a repeated description thereof will be omitted here.

In a specific implementation, in the embodiment of the disclosure, the first type of sub-pixels can include sub-pixels in a first color, and the second type of sub-pixels can include sub-pixels in a third color. For at least one electrode area of the source electrode area and the drain electrode area of transistor in the same position in different sub-pixels, the resistance of the electrode area of the transistor in the same position in each sub-pixel in the first color is larger than the resistance of the electrode area of the transistor in the same position in each sub-pixel in the third color, and the resistance of the other electrode area of each other transistor in each sub-pixel in the first color is the same as the resistance of the other electrode area of each other transistor in each sub-pixel in the third color. In this way, the resistance of at least one of the source electrode area and the drain electrode area can be adjusted so that the resistance of the first equivalent resistor is larger than the resistance of the second equivalent resistor; and the channel area does not need to be adjusted to thereby guarantee the characteristic of the thin film transistor.

In one embodiment, the respective thin film transistors electrically connected between the first power supply line, and the anode of the light-emitting element in the embodiment of the disclosure can be located at three positions, where a transistor at a first position is the first light-emitting control transistor M1, a transistor at a second position is the driver transistor M0, and a transistor at a third position is the light-emitting control transistor M2. In a specific implementation, the transistor in same position in the different sub-pixels in a first scheme may refer to the first light-emitting control transistor M1 in the sub-pixel in the first color, and the first light-emitting control transistor M1 in the sub-pixel in the third color; the transistor in the same position in the different sub-pixels in a second scheme may refer to: the driver transistor M0 in the sub-pixel in the first color, and the driver transistor M0 in the sub-pixel in the third color; and the transistor in the same position in the different sub-pixels in a third scheme may refer to: the second light-emitting control transistor M2 in the sub-pixel in the first color, and the second light-emitting control transistor M2 in the sub-pixel in the third color.

In a specific implementation, in the embodiment of the disclosure, the first type of sub-pixels can include sub-pixels in a second color, and the second type of sub-pixels can include sub-pixels in a third color, where for at least one electrode area of the source electrode area and the drain electrode area of transistors in at least one the same position in different sub-pixels, the resistance of the electrode area of the transistor in the same position in each sub-pixel in the second color is larger than the resistance of the electrode area of the transistor in the same position in each sub-pixel in the third color, and the resistance of the other electrode area of each other transistor in each sub-pixel in the second color is the same as the resistance of the other electrode area of each other transistor in each sub-pixel in the third color. In this way, the resistance of at least one of the source electrode area and the drain electrode area can be adjusted so that the resistance of the first equivalent resistor is larger than the resistance of the second equivalent resistor; and the channel area does not need to be adjusted to thereby guarantee the characteristic of the thin film transistor.

In one embodiment, the respective thin film transistors electrically connected between the first power supply line and the anode of the light-emitting element in the embodiment of the disclosure can be located at three positions, where a transistor at a first position is the first light-emitting control transistor M1, a transistor at a second position is the driver transistor M0, and a transistor at a third position is the light-emitting control transistor M2. In a specific implementation, the transistor in the same position in the different sub-pixels in a first scheme may refer to the first light-emitting control transistor M1 in the sub-pixel in the second color, and the first light-emitting control transistor M1 in the sub-pixel in the third color; the transistor in the same position in different sub-pixels in a second scheme may refer to the driver transistor M0 in the sub-pixel in the second color, and the driver transistor M0 in the sub-pixel in the third color; and the transistor in the same position in the different sub-pixels in a third scheme may refer to the second light-emitting control transistor M2 in the sub-pixel in the second color, and the second light-emitting control transistor M2 in the sub-pixel in the third color.

In one embodiment, the sub-pixels in the first color can be red sub-pixels, the sub-pixels in the second color can be green sub-pixels, and the sub-pixels in the third color can be blue sub-pixels. Of course, the sub-pixels in the first color, and the sub-pixels in the third color can be determined as needed in a real application environment, although the embodiment of the disclosure will not be limited thereto.

The disclosure will be described below in details in connection with specific embodiments thereof in which the sub-pixel in the first color can be red sub-pixel, the sub-pixel in the second color can be green sub-pixel, and the sub-pixel in the third color can be blue sub-pixel, for example. It shall be noted that the following embodiments are intended to better explain the disclosure, but not intended to limit the disclosure thereto.

1. In some possible embodiment, as illustrated in FIG. 6 to FIG. 9, the resistance of the source electrode area M1-S of the first light-emitting control transistor M1 in the red sub-pixel R is larger than the resistance of the source electrode area M1-S of the first light-emitting control transistor M1 in the blue sub-pixel B, and the resistance of the source electrode area M1-S of the first light-emitting control transistor M1 in the green sub-pixel G is larger than the resistance of the source electrode area M1-S of the first light-emitting control transistor M1 in the blue sub-pixel B; the resistance of the drain electrode area M1-D of the first light-emitting control transistor M1 in the red sub-pixel R is the same as the resistance of the drain electrode area M1-D of the first light-emitting control transistor M1 in the blue sub-pixel B, the resistance of the source electrode area M2-S of the second light-emitting control transistor M2 in the red sub-pixel R is the same as the resistance of the source electrode area M2-S of the second light-emitting control transistor M2 in the blue sub-pixel B, and the resistance of the drain electrode area M2-D of the second light-emitting control transistor M2 in the red sub-pixel R is the same as the resistance of the drain electrode area M2-D of the second light-emitting control transistor M2 in the blue sub-pixel B; the resistance of the source electrode area M0-S of the driver transistor M0 in the red sub-pixel R is the same as the resistance of the source electrode area M0-S of the driver transistor M0 in the blue sub-pixel B, the resistance of the drain electrode area M0-D of the driver transistor M0 in the red sub-pixel R is the same as the resistance of the drain electrode area M0-D of the driver transistor M0 in the blue sub-pixel B, and the resistance of the drain electrode area M1-D of the first light-emitting control transistor M1 in the green sub-pixel G is the same as the resistance of the drain electrode area M1-D of the first light-emitting control transistor M1 in the blue sub-pixels B; the resistance of the source electrode area M2-S of the second light-emitting control transistor M2 in the green sub-pixel G is the same as the resistance of the source electrode area M2-S of the second light-emitting control transistor M2 in the blue sub-pixel B, and the resistance of the drain electrode area M2-D of the second light-emitting control transistor M2 in the green sub-pixel G is the same as the resistance of the drain electrode area M2-D of the second light-emitting control transistor M2 in the blue sub-pixel B; and the resistance of the source electrode area M0-S of the driver transistor M0 in the green sub-pixel G is the same as the resistance of the source electrode area M0-S of the driver transistor M0 in the blue sub-pixel B, and the resistance of the drain electrode area M0-D of the driver transistor M0 in the green sub-pixel G is the same as the resistance of the drain electrode area M0-D of the driver transistor M0 in the blue sub-pixel B. In this way, only the resistances of the source electrode areas M1-S of the first light-emitting control transistors M1 in the red sub-pixels R, the green sub-pixels G, and the blue sub-pixels B can be adjusted so that the resistance of the first equivalent resistor of the red sub-pixel R is larger than the resistance of the second equivalent resistor of the blue sub-pixel B, and the resistance of the first equivalent resistor of the green sub-pixel G is larger than the resistance of the second equivalent resistor of the blue sub-pixel B.

For a conductor made of some material, its resistance R0 is in proportion to the length L0, and in inverse proportion to the cross-sectional area S0, that is, $$R0 = \frac{\rho L0}{S0},$$

where ρ represents the resistivity. In a specific implementation, in the embodiment of the disclosure, the cross-sectional area of an electrode area with a larger resistance can be smaller than the cross-sectional area of an electrode area with a smaller resistance, the resistivity of the electrode area with the larger resistance can be no smaller than the resistivity of the electrode area with the smaller resistance, and the length of the electrode area with the larger resistance can be no smaller than the length of the electrode area with the smaller resistance, where the resistivities of the source electrode areas and the drain electrode areas can be changed by changing the concentration, the type, etc., of doped ions.

In one embodiment, the cross-sectional area of an electrode area with a larger resistance can be smaller than the cross-sectional area of an electrode area with a smaller resistance, the resistivity of the electrode area with the larger resistance can be the same as the resistivity of the electrode area with the smaller resistance, and the length of the electrode area with the larger resistance can be the same as the length of the electrode area with the smaller resistance. In this way, the cross-sectional areas of the source electrodes M1-S of the first light-emitting control transistors M1 in the red sub-pixels R, the green sub-pixels G, and the blue sub-pixels B can be changed to thereby change the resistances thereof. In one embodiment, as illustrated in FIG. 10 to FIG. 13, the cross-sectional area $S0_{R-M1-S}$ of the source electrode area M1-S of the first light-emitting control transistor M1 in the red sub-pixel R is smaller than the cross-sectional area $S0_{B-M1-S}$ of the source electrode area M1-S of the first light-emitting control transistor M1 in the blue sub-pixel B; the resistance of the source electrode area M1-S of the first light-emitting control transistor M1 in the red sub-pixel R is the same as the resistance of the source electrode area M1-S of the first light-emitting control transistor M1 in the blue sub-pixel B; and the length of the source electrode area M1-S of the first light-emitting control transistor M1 in the red sub-pixel R is the same as the length of the source electrode area M1-S of the first light-emitting control transistor M1 in the blue sub-pixel B. As illustrated in FIG. 12 to FIG. 15, the cross-sectional area $S0_{G-M1-S}$ of the source electrode area M1-S of the first light-emitting control transistor M1 in the green sub-pixel G is smaller than the cross-sectional area $S0_{B-M1-S}$ of the source electrode area M1-S of the first light-emitting control transistor M1 in the blue sub-pixel B; the resistance of the source electrode area M1-S of the first light-emitting control transistor M1 in the green sub-pixel G is the same as the resistance of the source electrode area M1-S of the first light-emitting control transistor M1 in the blue sub-pixel B; and the length of the source electrode area M1-S of the first light-emitting control transistor M1 in the green sub-pixel G is the same as the length of the source electrode area M1-S of the first light-emitting control transistor M1 in the blue sub-pixel B.

In one embodiment, the cross-sectional area of an electrode area with a larger resistance can be smaller than the cross-sectional area of an electrode area with a smaller resistance, the resistivity of the electrode area with the larger resistance can be larger than the resistivity of the electrode area with the smaller resistance, and the length of the electrode area with the larger resistance can be the same as the length of the electrode area with the smaller resistance. In this way, the cross-sectional areas of the source electrode areas M1-S of the first light-emitting control transistors M1 in the red sub-pixel R, the green sub-pixel G, and the blue sub-pixel B can be changed to thereby change the resistances thereof, or the concentrations, the types, etc., of doped ions in the source electrode areas M1-S of the first light-emitting control transistors M1 in the red sub-pixel R, the green sub-pixel G, and the blue sub-pixel B can be changed to thereby change the resistivities and thus the resistances thereof.

In one embodiment, the cross-sectional area of an electrode area with a larger resistance can be smaller than the cross-sectional area of an electrode area with a smaller resistance, the resistivity of the electrode area with the larger resistance can be larger than the resistivity of the electrode area with the smaller resistance, and the length of the electrode area with the larger resistance can be larger than the length of the electrode area with the smaller resistance. In this way, the cross-sectional areas of the source electrode areas M1-S of the first light-emitting control transistors M1 in the red sub-pixel R, the green sub-pixel G, and the blue sub-pixel B can be changed to thereby change the resistances thereof, or the concentrations, the types, etc., of doped ions in the source electrode areas M1-S of the first light-emitting control transistors M1 in the red sub-pixel R, the green sub-pixel G, and the blue sub-pixel B can be changed to thereby change the resistivities and thus the resistances thereof, or the lengths of the source electrode areas M1-S of the first light-emitting control transistors M1 in the red sub-pixel R, the green sub-pixel G, and the blue sub-pixel B can be changed to thereby change the resistances thereof.

2. In some possible embodiment, as illustrated in FIG. 6 to FIG. 9, the resistance of the drain electrode area M1-D of the first light-emitting control transistor M1 in the red sub-pixel R is larger than the resistance of the drain electrode area M1-D of the first light-emitting control transistor M1 in the blue sub-pixel B, and the resistance of the drain electrode area M1-D of the first light-emitting control transistor M1 in the green sub-pixel G is larger than the resistance of the drain electrode area M1-D of the first light-emitting control transistor M1 in the blue sub-pixel B. The resistance of the source electrode area M1-S of the first light-emitting control transistor M1 in the red sub-pixels R is the same as the resistance of the source electrode area M1-S of the first light-emitting control transistor M1 in the blue sub-pixel B, the resistance of the source electrode area M2-S of the second light-emitting control transistor M2 in the red sub-pixel R is the same as the resistance of the source electrode area M2-S of the second light-emitting control transistor M2 in the blue sub-pixel B, and the resistance of the drain electrode area M2-D of the second light-emitting control transistor M2 in the red sub-pixel R is the same as the resistance of the drain electrode area M2-D of the second light-emitting control transistor M2 in the blue sub-pixel B; the resistance of the source electrode area M0-S of the driver transistor M0 in the red sub-pixel R is the same as the resistance of the source electrode area M0-S of the driver transistor M0 in the blue sub-pixel B, the resistance of the drain electrode area M0-D of the driver transistor M0 in the red sub-pixel R is the same as the resistance of the drain electrode area M0-D of the driver transistor M0 in the blue sub-pixel B, and the resistance of the source electrode area M1-S of the first light-emitting control transistor M1 in the green sub-pixel G is the same as the resistance of the source electrode area M1-S of the first light-emitting control transistor M1 in the blue sub-pixel B; the resistance of the source electrode area M2-S of the second light-emitting control transistor M2 in the green sub-pixel G is the same as the resistance of the source electrode area M2-S of the second light-emitting control transistor M2 in the blue sub-pixel B, and the resistance of the drain electrode area M2-D of the second light-emitting control transistor M2 in the green sub-pixel G is the same as the resistance of the drain electrode area M2-D of the second light-emitting control transistor M2 in the blue sub-pixel B. The resistance of the source electrode area M0-S of the driver transistor M0 in the green sub-pixel G is the same as the resistance of the source electrode area M0-S of the driver transistor M0 in the blue sub-pixel B, and the resistance of the drain electrode area M0-D of the driver transistor M0 in the green sub-pixel G is the same as the resistance of the drain electrode area M0-D of the driver transistor M0 in the blue sub-pixel B. In this way, only the resistances of the drain electrode areas M1-D of the first light-emitting control transistors M1 in the red sub-pixel R, the green sub-pixel G, and the blue sub-pixel B can be adjusted so that the resistance of the first equivalent resistor of the red sub-pixel R is larger than the resistance of the second equivalent resistor of the blue sub-pixel B, and the resistance of the first equivalent resistor of the green sub-pixel G is larger than the resistance of the second equivalent resistor of the blue sub-pixel B. Reference can be made to the embodiment above for an implementation of the resistance, so a repeated description thereof will be omitted.

In a specific implementation, in the embodiment of the disclosure, the resistivity of an electrode area with a larger resistance can be larger than the resistivity of an electrode area with a smaller resistance, the length of the electrode area with the larger resistance can be the same as the length of the electrode area with the smaller resistance, and the cross-sectional area of the electrode area with the larger resistance can be the same as the cross-sectional area of the electrode area with the smaller resistance. In this way, only the resistivity can be changed to thereby change the resistance.

In one embodiment, the resistivity of the drain electrode area M1-D of the first light-emitting control transistor M1 in the red sub-pixel R can be larger than the resistivity of the drain electrode area M1-D of the first light-emitting control transistor M1 in the blue sub-pixel B, the length of the drain electrode area M1-D of the first light-emitting control transistor M1 in the red sub-pixel R can be the same as the length of the drain electrode area M1-D of the first light-emitting control transistor M1 in the blue sub-pixel B, and the cross-sectional area of the drain electrode area M1-D of the first light-emitting control transistor M1 in the red sub-pixel R can be the same as the cross-sectional area of the drain electrode area M1-D of the first light-emitting control transistor M1 in the blue sub-pixel B. In this way, only the resistivities of the drain electrode areas M1-D of the first light-emitting control transistors M1 in the red sub-pixel R and the blue sub-pixel B can be changed to thereby change the resistances thereof.

In one embodiment, the resistivity of the drain electrode area M1-D of the first light-emitting control transistor M1 in the green sub-pixel G can be larger than the resistivity of the drain electrode area M1-D of the first light-emitting control transistor M1 in the blue sub-pixel B, the length of the drain electrode area M1-D of the first light-emitting control transistor M1 in the green sub-pixel G can be the same as the length of the drain electrode area M1-D of the first light-emitting control transistor M1 in the blue sub-pixel B, and the cross-sectional area of the drain electrode area M1-D of the first light-emitting control transistor M1 in the green sub-pixel G can be the same as the cross-sectional area of the drain electrode area M1-D of the first light-emitting control transistor M1 in the blue sub-pixel B. In this way, only the resistivities of the drain electrode areas M1-D of the first light-emitting control transistors M1 in the green sub-pixel G and the blue sub-pixel B can be changed to thereby change the resistances thereof.

3. In some possible embodiment, as illustrated in FIG. 6 to FIG. 9, the resistance of the drain electrode area M1-D of the first light-emitting control transistor M1 in the red sub-pixel R is larger than the resistance of the drain electrode area M1-D of the first light-emitting control transistor M1 in the blue sub-pixel B, and the resistance of the drain electrode area M0-D of the driver transistor M0 in the red sub-pixel G is larger than the resistance of the drain electrode area M0-D of the driver transistor M0 in the blue sub-pixel B. The resistance of the drain electrode area M1-D of the first light-emitting control transistor M1 in the green sub-pixel G is larger than the resistance of the drain electrode area M1-D of the first light-emitting control transistor M1 in the blue sub-pixel B, the resistance of the source electrode area M0-S of the driver transistor M0 in the green sub-pixel G is larger than the resistance of the source electrode area M0-S of the driver transistor M0 in the blue sub-pixel B, and the resistance of the source electrode area M1-S of the first light-emitting control transistor M1 in the red sub-pixel R is the same as the resistance of the source electrode area M1-S of the first light-emitting control transistor M1 in the blue sub-pixel B. The resistance of the source electrode area M2-S of the second light-emitting control transistor M2 in the red sub-pixel R is the same as the resistance of the source electrode area M2-S of the second light-emitting control transistor M2 in the blue sub-pixel B, the resistance of the drain electrode area M2-D of the second light-emitting control transistor M2 in the red sub-pixel R is the same as the resistance of the drain electrode area M2-D of the second light-emitting control transistor M2 in the blue sub-pixel B, and the resistance of the drain electrode area M0-D of the driver transistor M0 in the red sub-pixel R is the same as the resistance of the drain electrode area M0-D of the driver transistor M0 in the blue sub-pixel B. The resistance of the source electrode area M1-S of the first light-emitting control transistor M1 in the green sub-pixel G is the same as the resistance of the source electrode area M1-S of the first light-emitting control transistor M1 in the blue sub-pixel B, and the resistance of the drain electrode area M2-D of the second light-emitting control transistor M2 in the green sub-pixel G is the same as the resistance of the drain electrode area M2-D of the second light-emitting control transistor M2 in the blue sub-pixel B. The resistance of the drain electrode area M0-D of the driver transistor M0 in the green sub-pixel G is the same as the resistance of the drain electrode area M0-D of the driver transistor M0 in the blue sub-pixel B. In this way, only the resistances of the drain electrode areas M1-D of the first light-emitting control transistors M1, and the source electrode areas M0-S of the driver transistors M0 in the red sub-pixel R, the green sub-pixel G, and the blue sub-pixel B can be adjusted so that the resistance of the first equivalent resistor of the red sub-pixel R is larger than the resistance of the second equivalent resistor of the blue sub-pixel B, and the resistance of the first equivalent resistor of the green sub-pixel G is larger than the resistance of the second equivalent resistor of the blue sub-pixel B. It shall be noted that as illustrated in FIG. 8, the source electrode M0-S of the driver transistor M0 is formed by the same semiconductor layer as the drain electrode area M1-D of the first light-emitting control transistor M1 in a real formation process, so the source electrode M0-S of the driver transistor M0, and the drain electrode area M1-D of the first light-emitting control transistor M1 can be formed as a whole to thereby provide them with the same resistance as needed in the same formation process.

In a specific implementation, in the embodiment of the disclosure, the length of an electrode area with a larger resistance can be larger than the length of an electrode area with a smaller resistance, the cross-sectional area of the electrode area with the larger resistance can be the same as the cross-sectional area of the electrode area with the smaller resistance, and the resistivity of the electrode area with the larger resistance can be the same as the resistivity of the electrode area with the smaller resistance. In this way, only the lengths can be changed to thereby change the resistances.

In one embodiment, the length of the drain electrode area M1-D of the first light-emitting control transistor M1 in the red sub-pixel R can be larger than the length of the drain electrode area M1-D of the first light-emitting control transistor M1 in the blue sub-pixel B, the resistivity of the drain electrode area M1-D of the first light-emitting control transistor M1 in the red sub-pixel R can be the same as the resistivity of the drain electrode area M1-D of the first light-emitting control transistor M1 in the blue sub-pixel B, and the cross-sectional area of the drain electrode area M1-D of the first light-emitting control transistor M1 in the red sub-pixel R can be the same as the cross-sectional area of the drain electrode area M1-D of the first light-emitting control transistor M1 in the blue sub-pixel B. In this way, only the lengths of the drain electrode areas M1-D of the first light-emitting control transistors M1 in the red sub-pixel R and the blue sub-pixel B can be changed to thereby change the resistances thereof.

In one embodiment, the length of the source electrode area M0-S of the driver transistor M0 in the red sub-pixel R can be larger than the length of the source electrode area M0-S of the driver transistor M0 in the blue sub-pixel B, the resistivity of the source electrode area M0-S of the driver transistor M0 in the red sub-pixel R can be the same as the resistivity of the source electrode area M0-S of the driver transistor M0 in the blue sub-pixel B, and the cross-sectional area of the source electrode area M0-S of the driver transistor M0 in the red sub-pixel R can be the same as the cross-sectional area of the source electrode area M0-S of the driver transistor M0 in the blue sub-pixel B. In this way, only the lengths of the source electrode areas M0-S of the driver transistors M0 in the red sub-pixel R and the blue sub-pixel B can be changed to thereby change the resistances thereof.

In one embodiment, the length of the drain electrode area M1-D of the first light-emitting control transistor M1 in the green sub-pixel G can be larger than the length of the drain electrode area M1-D of the first light-emitting control transistor M1 in the blue sub-pixel B, the resistivity of the drain electrode area M1-D of the first light-emitting control transistor M1 in the green sub-pixel G can be the same as the resistivity of the drain electrode area M1-D of the first light-emitting control transistor M1 in the blue sub-pixel B, and the cross-sectional area of the drain electrode area M1-D of the first light-emitting control transistor M1 in the green sub-pixel G can be the same as the cross-sectional area of the drain electrode area M1-D of the first light-emitting control transistor M1 in the blue sub-pixel B. In this way, only the lengths of the drain electrode areas M1-D of the first light-emitting control transistors M1 in the green sub-pixel G and the blue sub-pixel B can be changed to thereby change the resistances thereof.

In one embodiment, the length of the source electrode area M0-S of the driver transistor M0 in the green sub-pixel G can be larger than the length of the source electrode area M0-S of the driver transistor M0 in the blue sub-pixel B, the resistivity of the source electrode area M0-S of the driver transistor M0 in the green sub-pixel G can be the same as the resistivity of the source electrode area M0-S of the driver transistor M0 in the blue sub-pixel B, and the cross-sectional area of the source electrode area M0-S of the driver transistor M0 in the green sub-pixel G can be the same as the cross-sectional area of the source electrode area M0-S of the driver transistor M0 in the blue sub-pixel B. In this way, only the lengths of the source electrode areas M0-S of the driver transistors M0 in the green sub-pixel G and the blue sub-pixel B can be changed to thereby change the resistances thereof.

4. In some possible embodiment, as illustrated in FIG. 6 to FIG. 9, the resistance of the source electrode area M2-S of the second light-emitting control transistor M2 in the red sub-pixels R is larger than the resistance of the source electrode area M2-S of the second light-emitting control transistor M2 in the blue sub-pixel B, and the resistance of the drain electrode area M0-D of the driver transistors M0 in the red sub-pixel R is larger than the resistance of the drain electrode area M0-D of the driver transistor M0 in the blue sub-pixel B. The resistance of the source electrode area M2-S of the second light-emitting control transistor M2 in the green sub-pixel G is larger than the resistance of the source electrode area M2-S of the second light-emitting control transistor M2 in the blue sub-pixel B, the resistance of the drain electrode area M0-D of the driver transistor M0 in the green sub-pixel G is larger than the resistance of the drain electrode area M0-D of the driver transistor M0 in the blue sub-pixel B, and the resistance of the source electrode area M1-S of the first light-emitting control transistor M1 in the red sub-pixel R is the same as the resistance of the source electrode area M1-S of the first light-emitting control transistor M1 in the blue sub-pixel B. The resistance of the drain electrode area M1-D of the first light-emitting control transistor M1 in the red sub-pixel R is the same as the resistance of the drain electrode area M1-D of the first light-emitting control transistor M1 in the blue sub-pixel B, the resistance of the drain electrode area M2-D of the second light-emitting control transistor M2 in the red sub-pixel R is the same as the resistance of the drain electrode area M2-D of the second light-emitting control transistor M2 in the blue sub-pixel B, and the resistance of the source electrode area M0-S of the driver transistor M0 in the red sub-pixel R is the same as the resistance of the source electrode area M0-S of the driver transistor M0 in the blue sub-pixel B. The resistance of the source electrode area M1-S of the first light-emitting control transistor M1 in the green sub-pixel G is the same as the resistance of the source electrode area M1-S of the first light-emitting control transistor M1 in the blue sub-pixel B, and the resistance of the drain electrode area M1-D of the first light-emitting control transistor M1 in the green sub-pixel G is the same as the resistance of the drain electrode area M1-D of the first light-emitting control transistor M1 in the blue sub-pixel B. The resistance of the drain electrode area M2-D of the second light-emitting control transistor M2 in the green sub-pixel G is the same as the resistance of the drain electrode area M2-D of the second light-emitting control transistor M2 in the blue sub-pixel B, and the resistance of the source electrode area M0-S of the driver transistor M0 in the green sub-pixel G is the same as the resistance of the source electrode area M0-S of the driver transistor M0 in the blue sub-pixel B. In this way, only the resistances of the source electrode areas M2-S of the second light-emitting control transistors M2, and the drain electrode areas M0-D of the driver transistors M0 in the red sub-pixel R, the green sub-pixel G, and the blue sub-pixel B can be adjusted so that the resistance of the first equivalent resistor of the red sub-pixel R is larger than the resistance of the second equivalent resistor of the blue sub-pixel B, and the resistance of the first equivalent resistor of the green sub-pixel G is larger than the resistance of the second equivalent resistor of the blue sub-pixel B. It shall be noted that as illustrated in FIG. 8, the drain electrode M0-D of the driver transistor M0 is formed using the same semiconductor layer as the source electrode area M2-S of the second light-emitting control transistor M2 in a real formation process, so the drain electrode M0-D of the driver transistor M0, and the source electrode area M2-S of the second light-emitting control transistor M2 can be formed as a whole to thereby provide them with the same resistance as needed in the same formation process. Reference can be made to the embodiment above for an implementation of the resistances, so a repeated description thereof will be omitted here.

5. In some possible embodiment, as illustrated in FIG. 6 to FIG. 9, the resistance of the drain electrode area M2-D of the second light-emitting control transistor M2 in the red sub-pixel R is larger than the resistance of the drain electrode area M2-D of the second light-emitting control transistor M2 in the blue sub-pixel B, and the resistance of the drain electrode area M2-D of the second light-emitting control transistor M2 in the green sub-pixel G is larger than the resistance of the drain electrode area M2-D of the second light-emitting control transistor M2 in the blue sub-pixel B. The resistance of the source electrode area M1-S of the first light-emitting control transistor M1 in the red sub-pixel R is the same as the resistance of the source electrode area M1-S of the first light-emitting control transistor M1 in the blue sub-pixel B, the resistance of the drain electrode area M1-D of the first light-emitting control transistor M1 in the red sub-pixel R is the same as the resistance of the drain electrode area M1-D of the first light-emitting control transistor M1 in the blue sub-pixel B, and the resistance of the source electrode area M2-S of the second light-emitting control transistor M2 in the red sub-pixel R is the same as the resistance of the source electrode area M2-S of the second light-emitting control transistor M2 in the blue sub-pixel B. The resistance of the source electrode area M0-S of the driver transistor M0 in the red sub-pixel R is the same as the resistance of the source electrode area M0-S of the driver transistor M0 in the blue sub-pixel B, the resistance of the drain electrode area M0-D of the driver transistor M0 in the red sub-pixel R is the same as the resistance of the drain electrode area M0-D of the driver transistor M0 in the blue sub-pixel B, and the resistance of the source electrode area M1-S of the first light-emitting control transistor M1 in the green sub-pixel G is the same as the resistance of the source electrode area M1-S of the first light-emitting control transistor M1 in the blue sub-pixel B. The resistance of the drain electrode area M1-D of the first light-emitting control transistor M1 in the green sub-pixel G is the same as the resistance of the drain electrode area M1-D of the first light-emitting control transistor M1 in the blue sub-pixel B, and the resistance of the source electrode area M2-S of the second light-emitting control transistor M2 in the green sub-pixel G is the same as the resistance of the source electrode area M2-S of the second light-emitting control transistor M2 in the blue sub-pixel B. The resistance of the source electrode area M0-S of the driver transistor M0 in the green sub-pixel G is the same as the resistance of the source electrode area M0-S of the driver transistor M0 in the blue sub-pixel B, and the resistance of the drain electrode area M0-D of the driver transistor M0 in the green sub-pixel G is the same as the resistance of the drain electrode area M0-D of the driver transistor M0 in the blue sub-pixel B. In this way, only the resistances of the drain electrode areas M2-D of the second light-emitting control transistors M2 in the red sub-pixel R, the green sub-pixel G, and the blue sub-pixel B can be adjusted so that the resistance of the first equivalent resistor of the red sub-pixel R is larger than the resistance of the second equivalent resistor of the blue sub-pixel B, and the resistance of the first equivalent resistor of the green sub-pixel G is larger than the resistance of the second equivalent resistor of the blue sub-pixel B. Reference can be made to the embodiment above for an implementation of the resistances, so a repeated description thereof will be omitted here.

It shall be noted that the embodiments above, and the features in the embodiments can be combined with each other unless they conflict with each other, so a repeated description thereof will be omitted here.

It shall be noted that same relationships between the features above may not be exactly same due to a process factor or another factor in a real process, but may be somewhat different, so the same relationships between the features above can be substantially same without departing from the scope of the disclosure. In one embodiment, there may be an allowable error thereof.

Based upon the same inventive idea, an embodiment of the disclosure further provides a display device including the display panel above according to the embodiment of the disclosure. The display device addresses the problem under a similar principle to the display panel above, so reference can be made to the implementation of the display device for an implementation of the display panel above, so a repeated description thereof will be omitted here.

Figure 16:
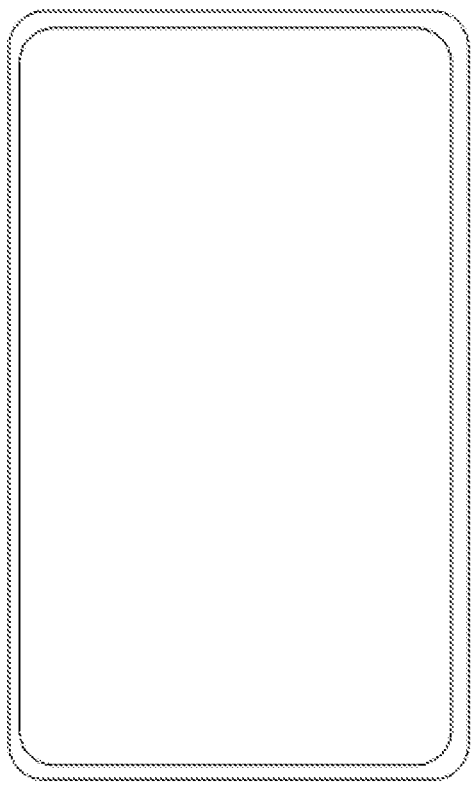
FIG. 16 is a schematic structural diagram of a display device in accordance with an embodiment of the disclosure.

In a specific implementation, the display device according to the embodiment of the disclosure can be an all-screen phone as illustrated in FIG. 16. Of course, in a real application, the display device according to the embodiment of the disclosure can be a tablet computer, a TV set, a display, a notebook computer, a digital photo frame, a navigator, or any other product or component with a display function.

In the display panel and the display device according to the embodiments of the disclosure, the voltage difference U0 between the first power supply line PVDD and the second power supply line PVEE in each sub-pixel among the first type of sub-pixels is the sum of the voltage difference U11 between the anode of the light-emitting element L-1, and the first power supply line PVDD, and the voltage difference U12 between the anode and the cathode of the light-emitting element L-1, that is, U0=U11+U12. The voltage difference U0 between the first power supply line PVDD and the second power supply line PVEE in each sub-pixel among the second type of sub-pixels is the sum of the voltage difference U21 between the anode of the light-emitting element L-2, and the first power supply line PVDD, and the voltage difference U22 between the anode and a cathode of the light-emitting element L-2, that is, U0=U21+U22. The resistance of the first equivalent resistor RE1 is larger than the resistance of the second equivalent resistor RE2 so that voltage across the first equivalent resistor RE1 is higher, so U11 is higher, and thus U12 is lower. In this way, when the second type of sub-pixel Subpx-2 is driven to be lightened, and the first type of sub-pixel Subpx-1 is driven not to be lightened, U12 can be lower than the turn-on voltage of the light-emitting element L-1 due to the higher voltage across the first equivalent resistor RE1 despite leakages current, so that the first type of sub-pixel can be avoided from being lightened, to thereby alleviate a display abnormality, and improve a display effect.

What is claimed is:

1. A display panel, comprising:
  a plurality of pixel elements and a first power supply line, wherein each of the plurality of pixel elements comprises a plurality of sub-pixels, wherein each of the plurality of sub-pixels comprises a light-emitting element and a pixel circuit, and an anode of the light-emitting element is electrically connected with the first power supply line through the pixel circuit;
  wherein the plurality of sub-pixels comprise a first type of sub-pixels and a second type of sub-pixels, wherein a turn-on voltage of the light-emitting element in each of the first type of sub-pixels is lower than a turn-on voltage of the light-emitting element in each of the second type of sub-pixels; and
  a first equivalent resistor between the anode of the light-emitting element in each of the first type of sub-pixels and the first power supply line, and a second equivalent resistor between the anode of the light-emitting element in each of the second type of sub-pixels and the first power supply line, wherein a resistance of the first equivalent resistor is larger than a resistance of the second equivalent resistor.

2. The display panel according to claim 1, wherein the pixel circuit comprises a plurality of thin film transistors electrically connected between the first power supply line and the anode of the light-emitting element;
  wherein the resistance of the first equivalent resistor is a sum of resistances of active layers of all of the plurality of thin film transistors electrically connected between the first power supply line and the anode of the light-emitting element in one of the first type of sub-pixels; and
  wherein the resistance of the second equivalent resistor is a sum of resistances of active layers of all of the plurality of thin film transistors electrically connected between the first power supply line and the anode of the light-emitting element in one of the second type of sub-pixels.

3. The display panel according to claim 2, wherein an active layer of each of the plurality of thin film transistors comprises a channel area, and a source electrode area and a drain electrode area located respectively on two sides of the channel area;
  wherein the resistance of the first equivalent resistor is a sum of resistances of source electrode areas and resistances of drain electrode areas of all of the plurality of thin film transistors electrically connected between the first power supply line and the anode of the light-emitting element in one of the first type of sub-pixels; and
  wherein the resistance of the second equivalent resistor is a sum of resistances of the source electrode areas and resistances of drain electrode areas of all of the plurality of thin film transistors electrically connected between the first power supply line and the anode of the light-emitting element in one of the second type of sub-pixels.

4. The display panel according to claim 3, wherein the first type of sub-pixels comprise sub-pixels in a first color, and the second type of sub-pixels comprise sub-pixels in a third color; and
  for at least one electrode area of the source electrode area and the drain electrode area of the plurality of thin film transistors in a same position in different sub-pixels, a resistance of the at least one electrode area of the plurality of thin film transistors in the same position in each sub-pixel in the first color is larger than a resistance of the at least one electrode area of the plurality of thin film transistors in the same position in each sub-pixel in the third color, and
  a resistance of the other electrode area of the plurality of thin film transistors in each sub-pixel in the first color is same as resistance of the other electrode area of the plurality of thin film transistors in each sub-pixel in the third color.

5. The display panel according to claim 3, wherein the first type of sub-pixels comprise sub-pixels in a second color, and the second type of sub-pixels comprise sub-pixels in a third color; and
  for at least one electrode area of the source electrode area and the drain electrode area of the plurality of thin film transistors in a same position in different sub-pixels, a resistance of the electrode area of the plurality of thin film transistors in the same position in each sub-pixel in the second color is larger than a resistance of the at least one electrode area of the plurality of thin film transistors in the same position in each sub-pixel in the third color, and
  a resistance of the other electrode area of the plurality of thin film transistors in each sub-pixel in the second color is same as resistance of the other electrode area of the plurality of thin film transistors in each sub-pixel in the third color.

6. The display panel according to claim 4, wherein the first type of sub-pixels further comprise sub-pixels in a second color; and
  the resistance of the at least one electrode area of the plurality of thin film transistors in the same position in each sub-pixel in the second color is larger than a resistance of the at least one electrode area of the plurality of thin film transistors in the same position in each sub-pixel in the third color, and
  the resistance of the other electrode area of the plurality of thin film transistors in each sub-pixel in the second color is same as resistance of the other electrode area of the plurality of thin film transistors in each sub-pixel in the third color.

7. The display panel according to claim 2, wherein the plurality of thin film transistors comprise a driver transistor, a first light-emitting control transistor, and a second light-emitting control transistor;
  the first light-emitting control transistor has a source electrode area electrically connected with the first power supply line, and a drain electrode area electrically connected with a source electrode area of the driver transistor; and
  the driver transistor has a drain electrode area electrically connected with a source electrode area of the second light-emitting control transistor, and the second light-emitting control transistor has a drain electrode area electrically connected with the anode of the light-emitting element.

8. The display panel according to claim 4, wherein a cross-sectional area of the at least one electrode area with a larger resistance is smaller than a cross-sectional area of the at least one electrode area with a smaller resistance;
   a resistivity of the at least one electrode area with the larger resistance is larger than or equal to a resistivity of the at least one electrode area with the smaller resistance; and
   a length of the at least one electrode area with the larger resistance is larger than or equal to a length of the at least one electrode area with the smaller resistance.

9. The display panel according to claim 4, wherein a resistivity of the at least one electrode area with a larger resistance is larger than a resistivity of the at least one electrode area with a smaller resistance;
   a length of the at least one electrode area with the larger resistance is the same as a length of the at least one electrode area with the smaller resistance; and
   a cross-sectional area of the at least one electrode area with the larger resistance is the same as a cross-sectional area of the at least one electrode area with the smaller resistance.

10. The display panel according to claim 4, wherein a length of the at least one electrode area with a larger resistance is larger than a length of the at least one electrode area with a smaller resistance;
    a cross-sectional area of the at least one electrode area with the larger resistance is the same as a cross-sectional area of the at least one electrode area with the smaller resistance; and
    a resistivity of the at least one electrode area with the larger resistance is the same as a resistivity of the at least one electrode area with the smaller resistance.

11. The display panel according to claim 4, wherein the sub-pixels in the first color are red sub-pixels, the sub-pixels in a second color are green sub-pixels, and the sub-pixels in the third color are blue sub-pixels.

12. The display panel according to claim 5, wherein a cross-sectional area of the at least one electrode area with a larger resistance is smaller than a cross-sectional area of the at least one electrode area with a smaller resistance;
    a resistivity of the at least one electrode area with the larger resistance is larger than or equal to a resistivity of the at least one electrode area with the smaller resistance; and
    a length of the at least one electrode area with the larger resistance is larger than or equal to a length of the at least one electrode area with the smaller resistance.

13. The display panel according to claim 5, wherein a resistivity of the at least one electrode area with a larger resistance is larger than a resistivity of the at least one electrode area with a smaller resistance;
    a length of the at least one electrode area with the larger resistance is the same as a length of the at least one electrode area with the smaller resistance; and
    a cross-sectional area of the at least one electrode area with the larger resistance is the same as a cross-sectional area of the at least one electrode area with the smaller resistance.

14. The display panel according to claim 5, wherein a length of the at least one electrode area with a larger resistance is larger than a length of the at least one electrode area with a smaller resistance;
    a cross-sectional area of the at least one electrode area with the larger resistance is the same as a cross-sectional area of the at least one electrode area with the smaller resistance; and
    a resistivity of the at least one electrode area with the larger resistance is the same as a resistivity of the at least one electrode area with the smaller resistance.

15. The display panel according to claim 5, wherein the sub-pixels in a first color are red sub-pixels, the sub-pixels in the second color are green sub-pixels, and the sub-pixels in the third color are blue sub-pixels.

16. A display device, comprising:
    a display panel, wherein:
      the display panel comprises a plurality of pixel elements and a first power supply line, wherein each of the plurality of pixel elements comprises a plurality of sub-pixels, each of the plurality of sub-pixels comprises a light-emitting element and a pixel circuit, and an anode of the light-emitting element is electrically connected with the first power supply line through the pixel circuit;
      the plurality of sub-pixels comprise a first type of sub-pixels and a second type of sub-pixels, wherein a turn-on voltage of the light-emitting element in each of the first type of sub-pixels is lower than a turn-on voltage of the light-emitting element in each of the second type of sub-pixels; and
      a first equivalent resistor between the anode of the light-emitting element in each of the first type of sub-pixels and the first power supply line, and a second equivalent resistor between the anode of the light-emitting element in each of the second type of sub-pixels and the first power supply line, wherein a resistance of the first equivalent resistor is larger than a resistance of the second equivalent resistor.

* * * * *